(12) United States Patent
Hirata et al.

(10) Patent No.: US 12,074,030 B2
(45) Date of Patent: Aug. 27, 2024

(54) ETCHING METHOD OF OXIDE SEMICONDUCTOR FILM, OXIDE SEMICONDUCTOR WORKPIECE, AND ELECTRONIC DEVICE

(71) Applicant: SONY SEMICONDUCTOR SOLUTIONS CORPORATION, Kanagawa (JP)

(72) Inventors: Akiko Hirata, Kanagawa (JP); Masanaga Fukasawa, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 811 days.

(21) Appl. No.: 17/049,496

(22) PCT Filed: Apr. 10, 2019

(86) PCT No.: PCT/JP2019/015555
§ 371 (c)(1),
(2) Date: Oct. 21, 2020

(87) PCT Pub. No.: WO2019/216092
PCT Pub. Date: Nov. 14, 2019

(65) Prior Publication Data
US 2021/0249273 A1 Aug. 12, 2021

(30) Foreign Application Priority Data
May 8, 2018 (JP) .................. 2018-089982
Jan. 11, 2019 (JP) .................. 2019-003233

(51) Int. Cl.
*H01L 21/3065* (2006.01)
*H01L 21/30* (2006.01)
(Continued)

(52) U.S. Cl.
CPC .......... *H01L 21/3065* (2013.01); *H01L 21/30* (2013.01); *H01L 21/465* (2013.01); *H01L 29/24* (2013.01)

(58) Field of Classification Search
None
See application file for complete search history.

(56) References Cited

U.S. PATENT DOCUMENTS

| 5,888,410 A | 3/1999 | Ishihara et al. |
| 2006/0108658 A1 | 5/2006 | Araki |

(Continued)

FOREIGN PATENT DOCUMENTS

| CN | 104603917 A | 5/2015 |
| EP | 2879167 A1 | 6/2015 |

(Continued)

OTHER PUBLICATIONS

Sherpa, et al., "Quasi-atomic layer etching of silicon nitride", Journal of Vacuum Science & Technology A, vol. 35, 01A102 (2017), DOI: 10.1116/1.4967236, Jan. 2017, 08 pages.

(Continued)

*Primary Examiner* — Michael Lebentritt
(74) *Attorney, Agent, or Firm* — CHIP LAW GROUP

(57) ABSTRACT

A first etching method of an oxide semiconductor film according to an embodiment of the present disclosure includes: forming a reduction layer in an oxide semiconductor film with use of a reducing gas; and sputtering the reduction layer with use of a rare gas.

18 Claims, 20 Drawing Sheets

(51) Int. Cl.
*H01L 21/465* (2006.01)
*H01L 29/24* (2006.01)

(56) References Cited

U.S. PATENT DOCUMENTS

| | | | |
|---|---|---|---|
| 2007/0287296 | A1 | 12/2007 | Chang |
| 2008/0237793 | A1* | 10/2008 | Oshida .................... H01L 28/84 |
| | | | 257/532 |
| 2015/0221522 | A1 | 8/2015 | Harada et al. |
| 2016/0059261 | A1* | 3/2016 | Nishio .................. B05D 3/065 |
| | | | 428/448 |
| 2017/0288169 | A1* | 10/2017 | Ito ......................... C23C 16/509 |

FOREIGN PATENT DOCUMENTS

| | | | | | |
|---|---|---|---|---|---|
| JP | H0279446 | A | * | 3/1990 | |
| JP | H08323150 | A | * | 12/1996 | |
| JP | 09-326298 | A | | 12/1997 | |
| JP | 10-010549 | A | | 1/1998 | |
| JP | 2000005886 | A | * | 1/2000 | |
| JP | 2000332009 | A | * | 11/2000 | |
| JP | 2006-054447 | A | | 2/2006 | |
| JP | 2007059128 | A | * | 3/2007 | ......... H01L 27/1248 |
| JP | 2007-335505 | A | | 12/2007 | |
| JP | 2008-244020 | A | | 10/2008 | |
| JP | 2011222530 | A | * | 11/2011 | ......... H01L 27/1248 |
| JP | 4921604 | B2 | * | 4/2012 | ......... H01L 27/1248 |
| JP | 2015035607 | A | * | 2/2015 | ......... H01L 27/1225 |
| JP | 2018-089982 | A | | 6/2018 | |
| JP | 2019-003233 | A | | 1/2019 | |
| KR | 10-2015-0048135 | A | | 5/2015 | |
| TW | 201220479 | A | * | 5/2012 | ............ G11C 11/404 |
| TW | 201423861 | A | | 6/2014 | |
| WO | WO-2013021632 | A1 | * | 2/2013 | ......... C23C 14/0057 |
| WO | 2014/34674 | A1 | | 3/2014 | |

OTHER PUBLICATIONS

International Search Report and Written Opinion of PCT Application No. PCT/JP2019/015555, issued on Jun. 18, 2019, 09 pages of ISRWO.

* cited by examiner

[FIG. 1A]
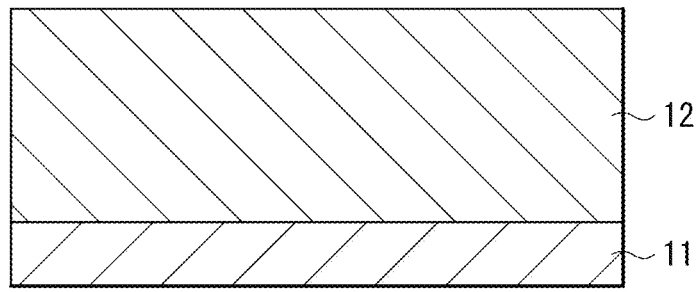
[FIG. 1B]
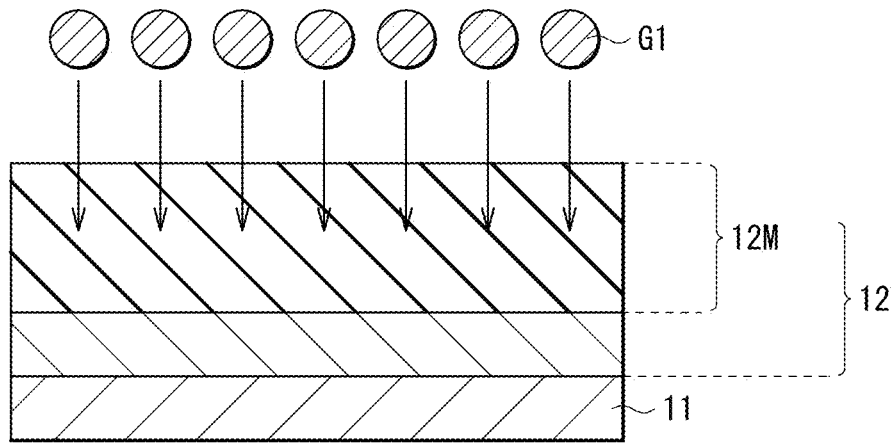
[FIG. 1C]
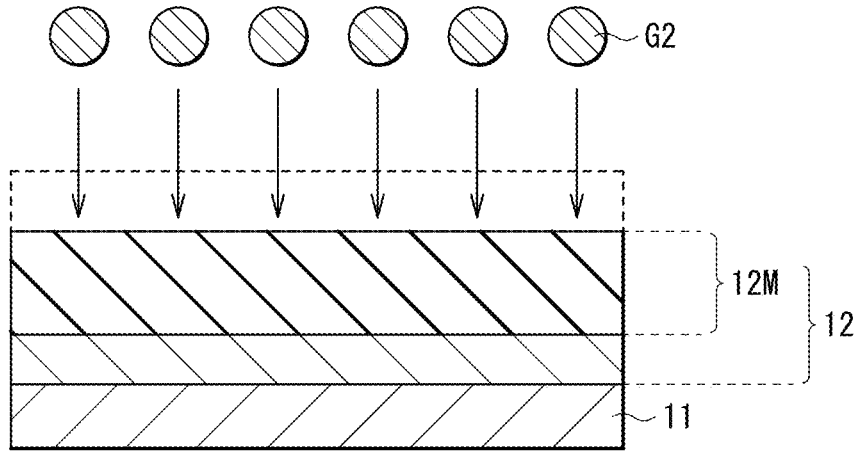

[FIG. 2]
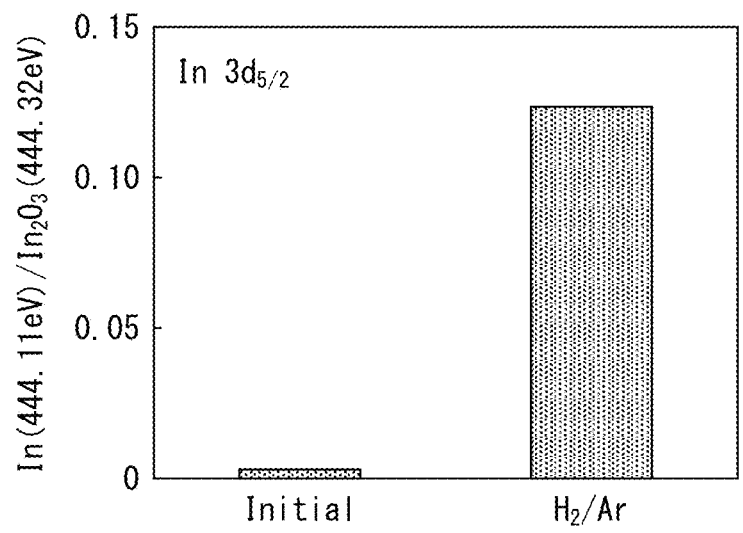

[FIG. 3A]
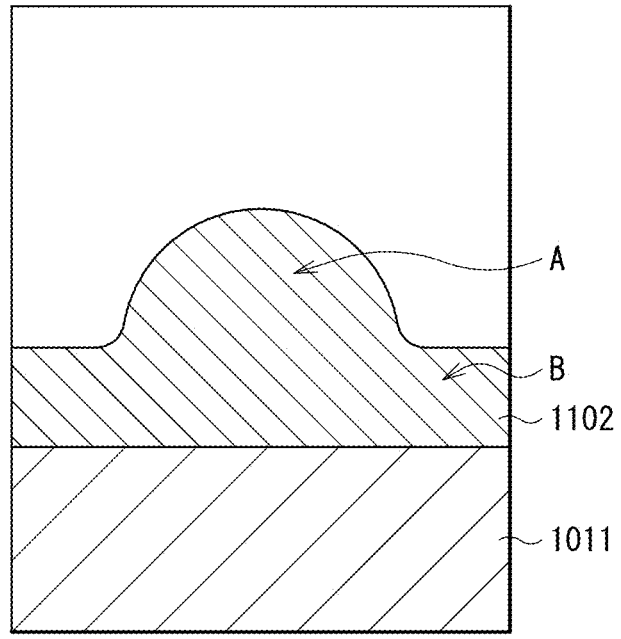
[FIG. 3B]
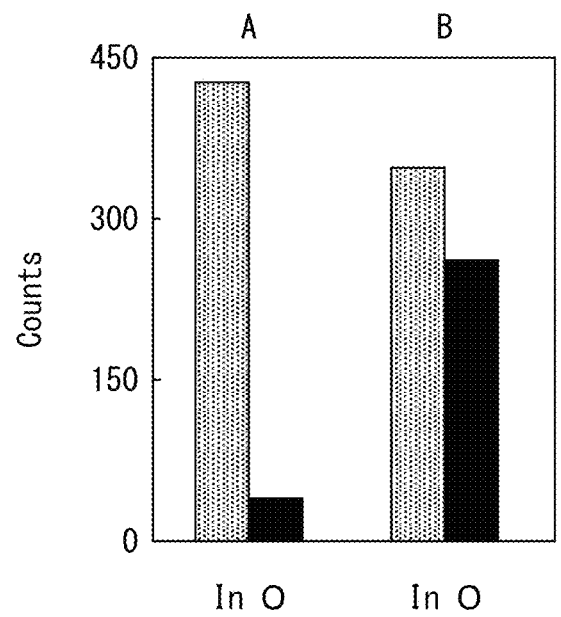

[FIG. 4A]
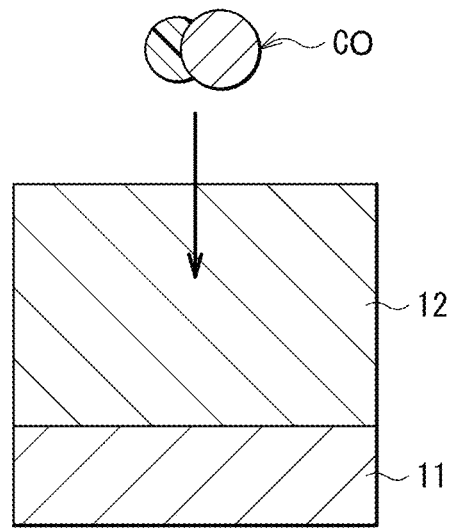
[FIG. 4B]
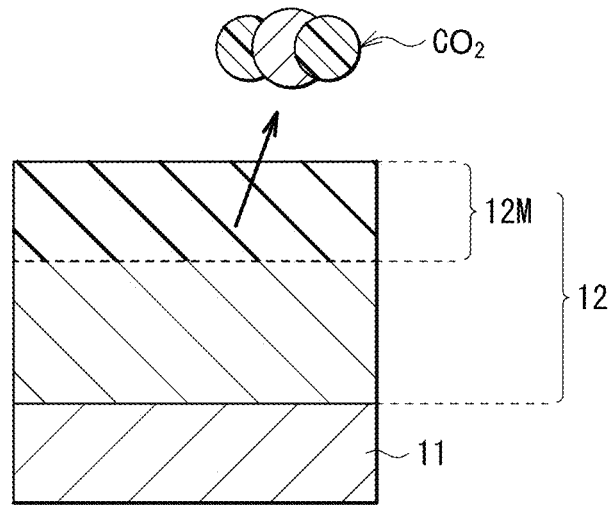
[FIG. 4C]
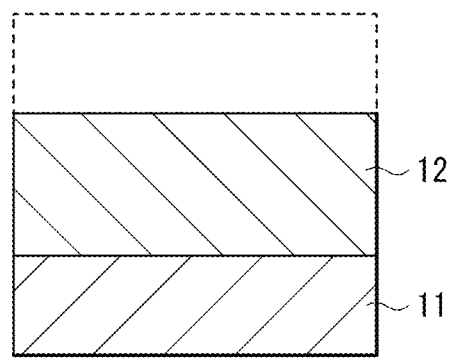

[FIG. 5A]
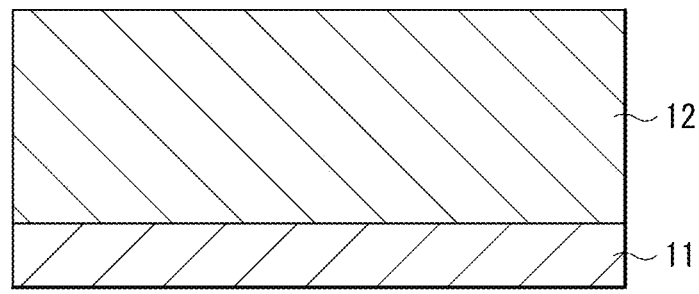
[FIG. 5B]
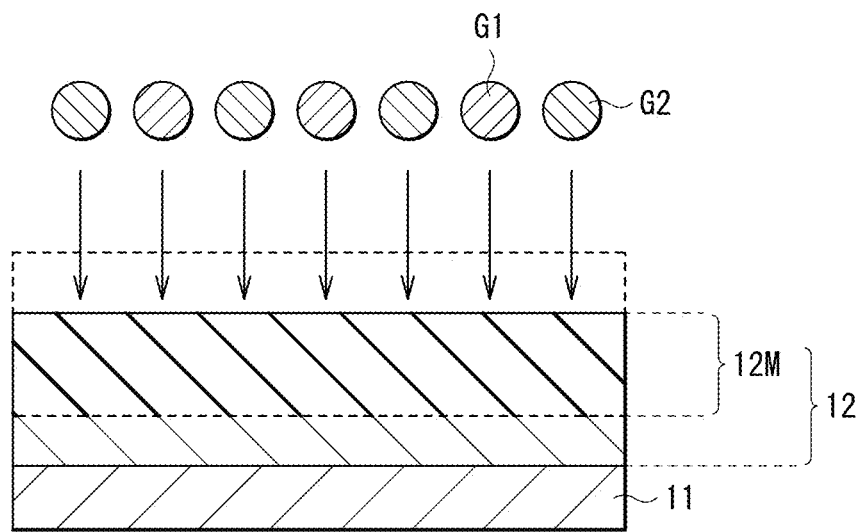

[FIG. 6A]
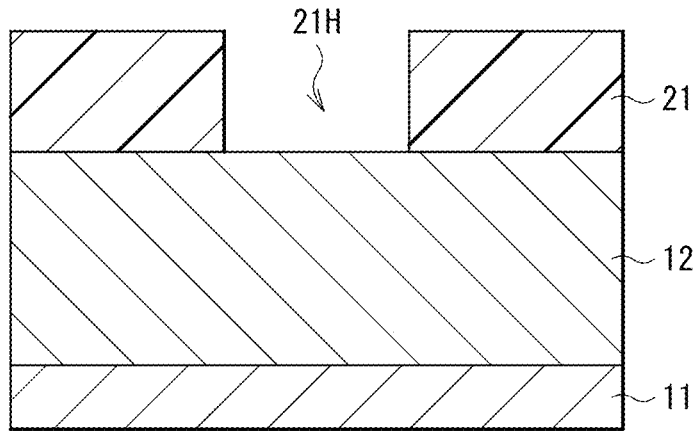
[FIG. 6B]
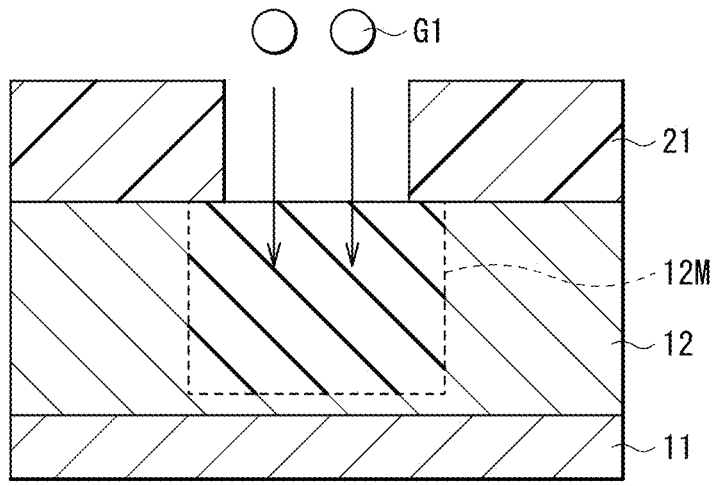
[FIG. 6C]
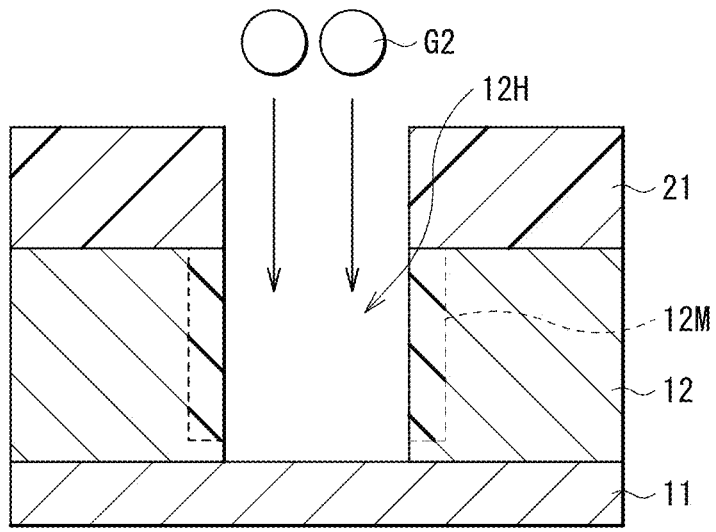

[FIG. 7A]
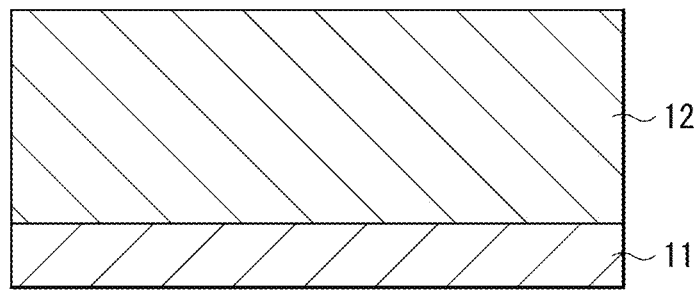
[FIG. 7B]
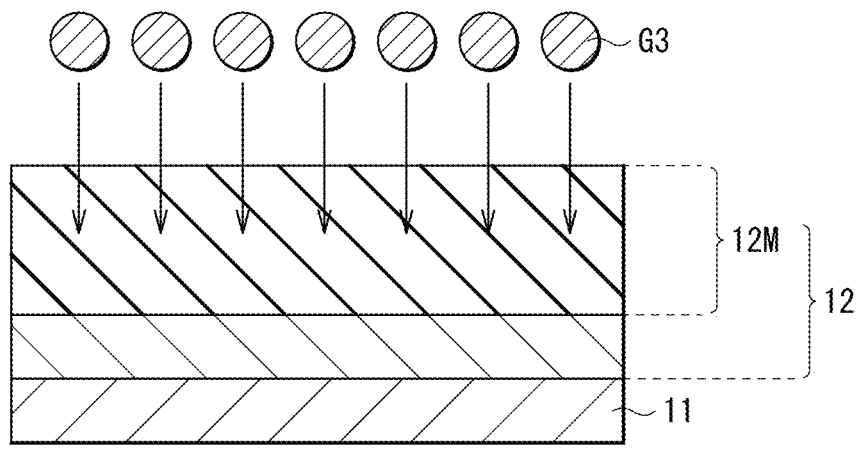
[FIG. 7C]
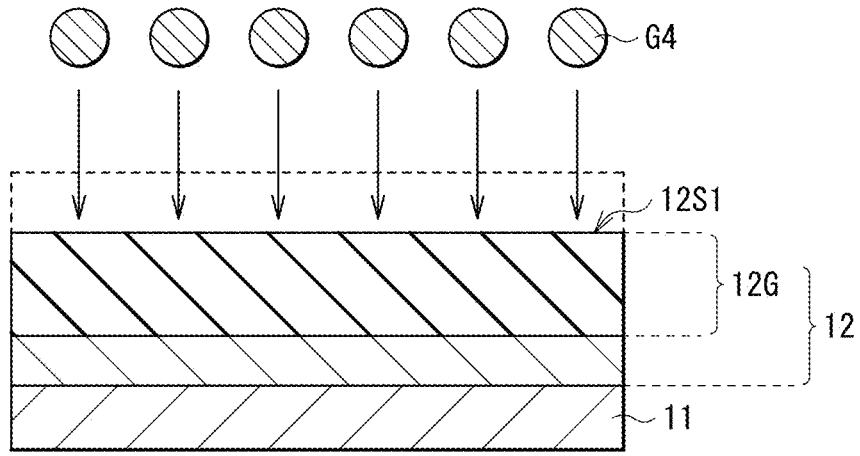

[FIG. 8]
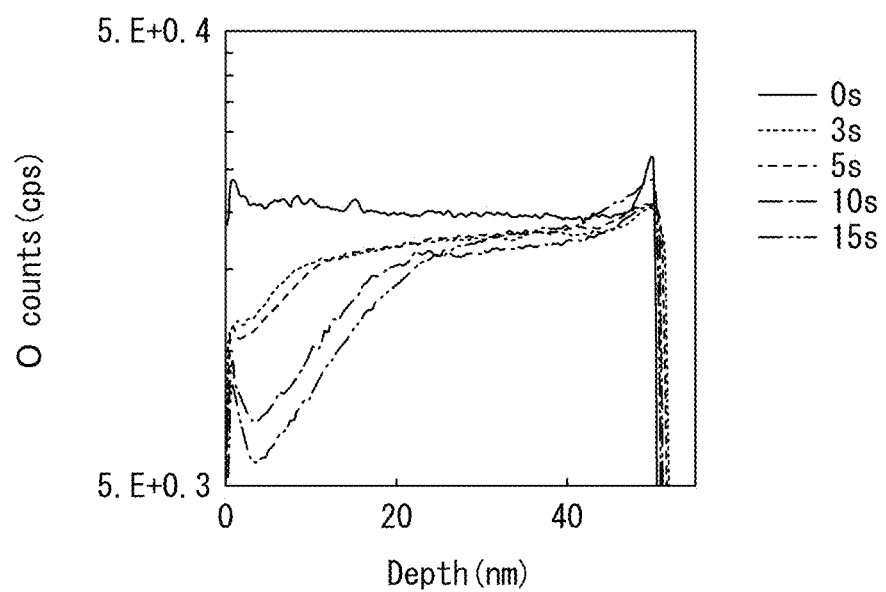
[FIG. 9]
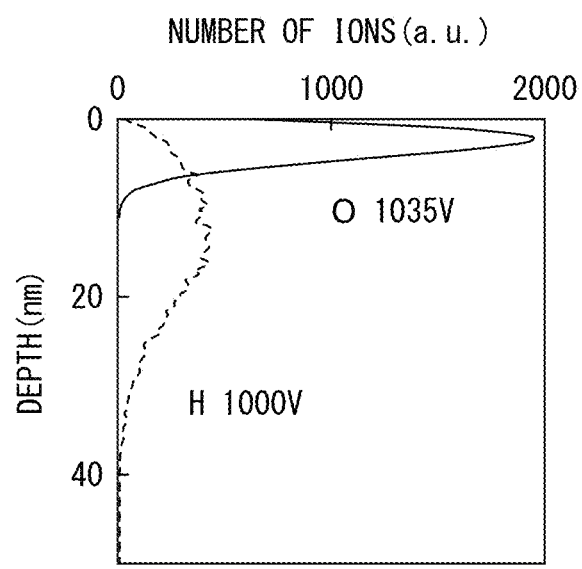

[FIG. 10]
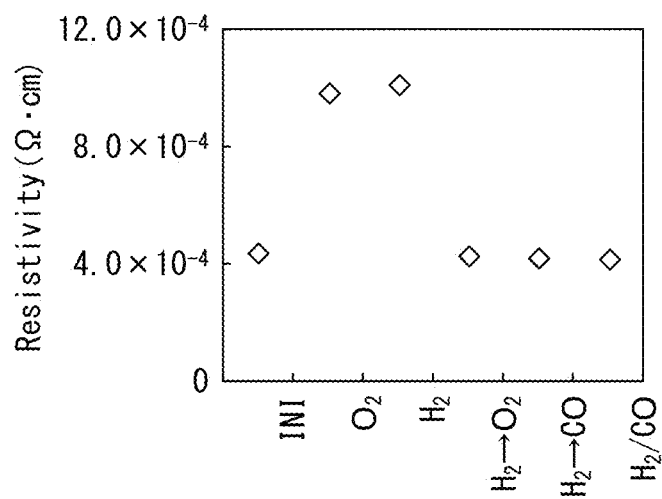
[FIG. 11]
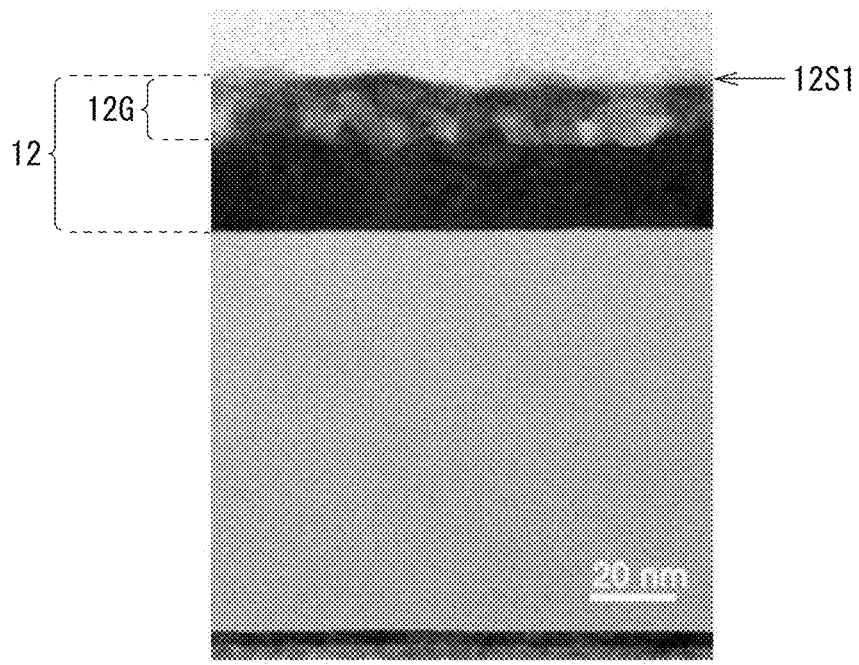

[FIG. 12A]
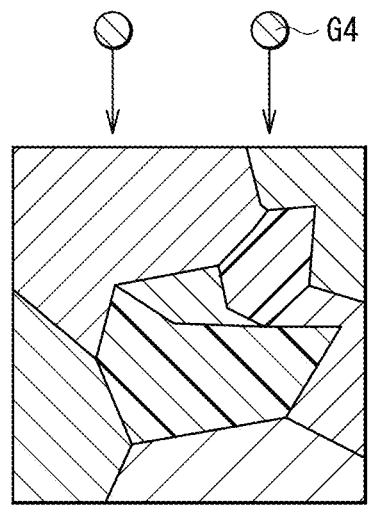
[FIG. 12B]
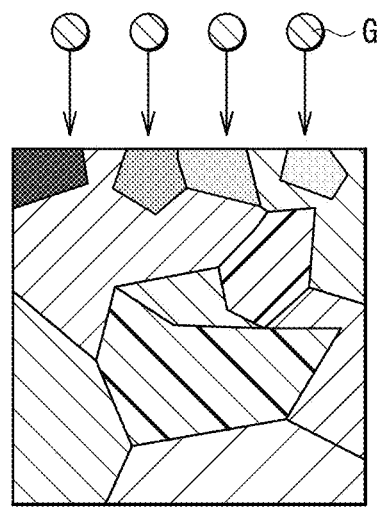
[FIG. 12C]
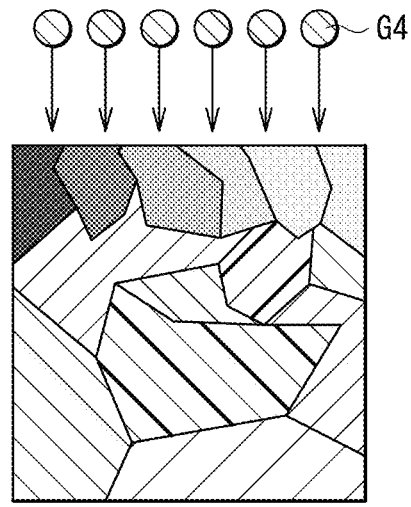

[FIG. 13]
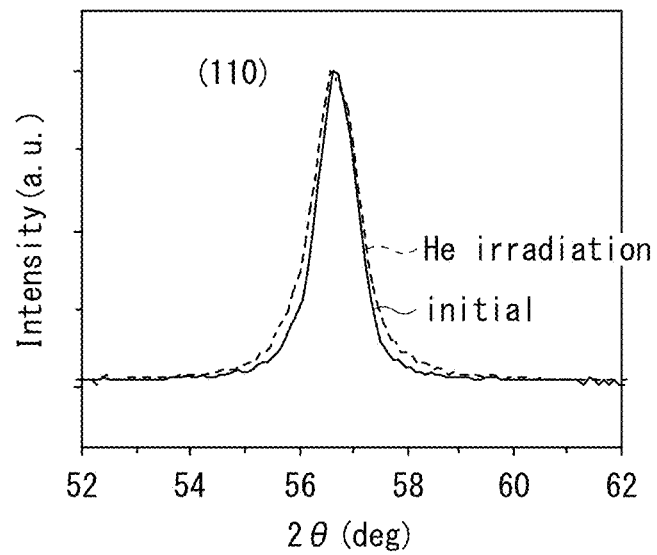

[FIG. 14A]
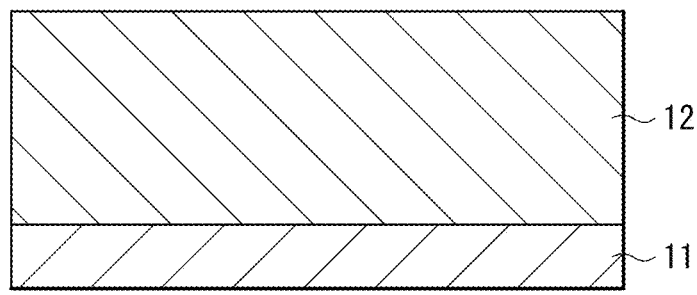
[FIG. 14B]
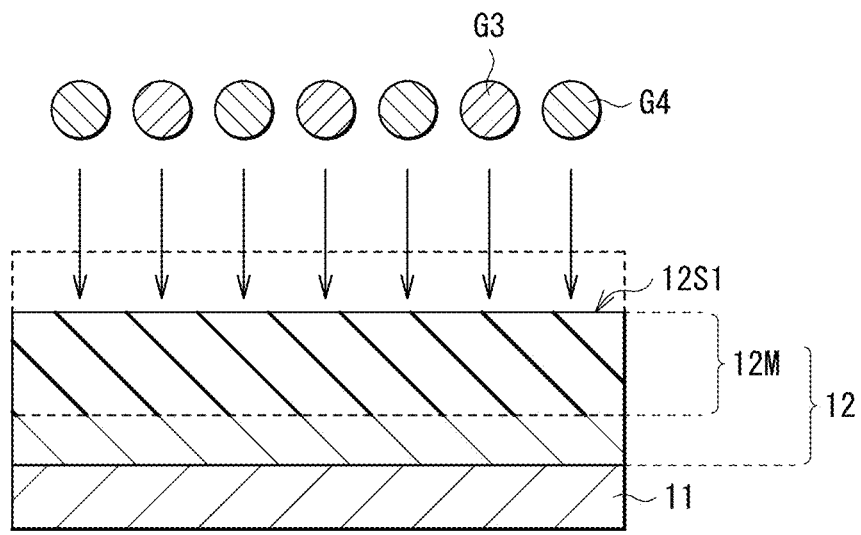

[FIG. 15A]
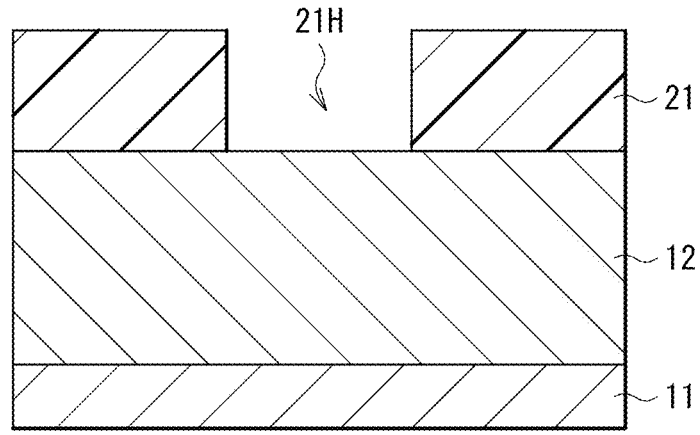
[FIG. 15B]
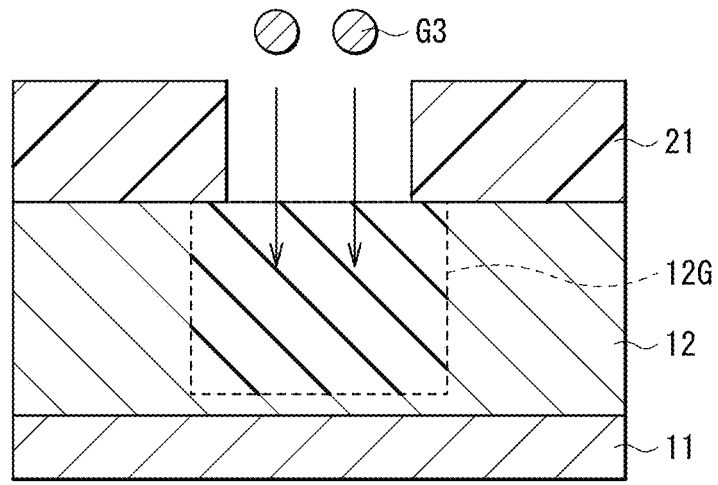
[FIG. 15C]
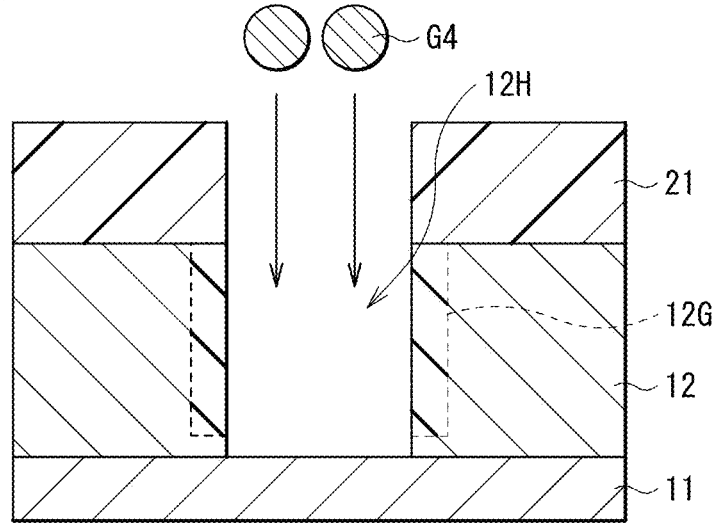

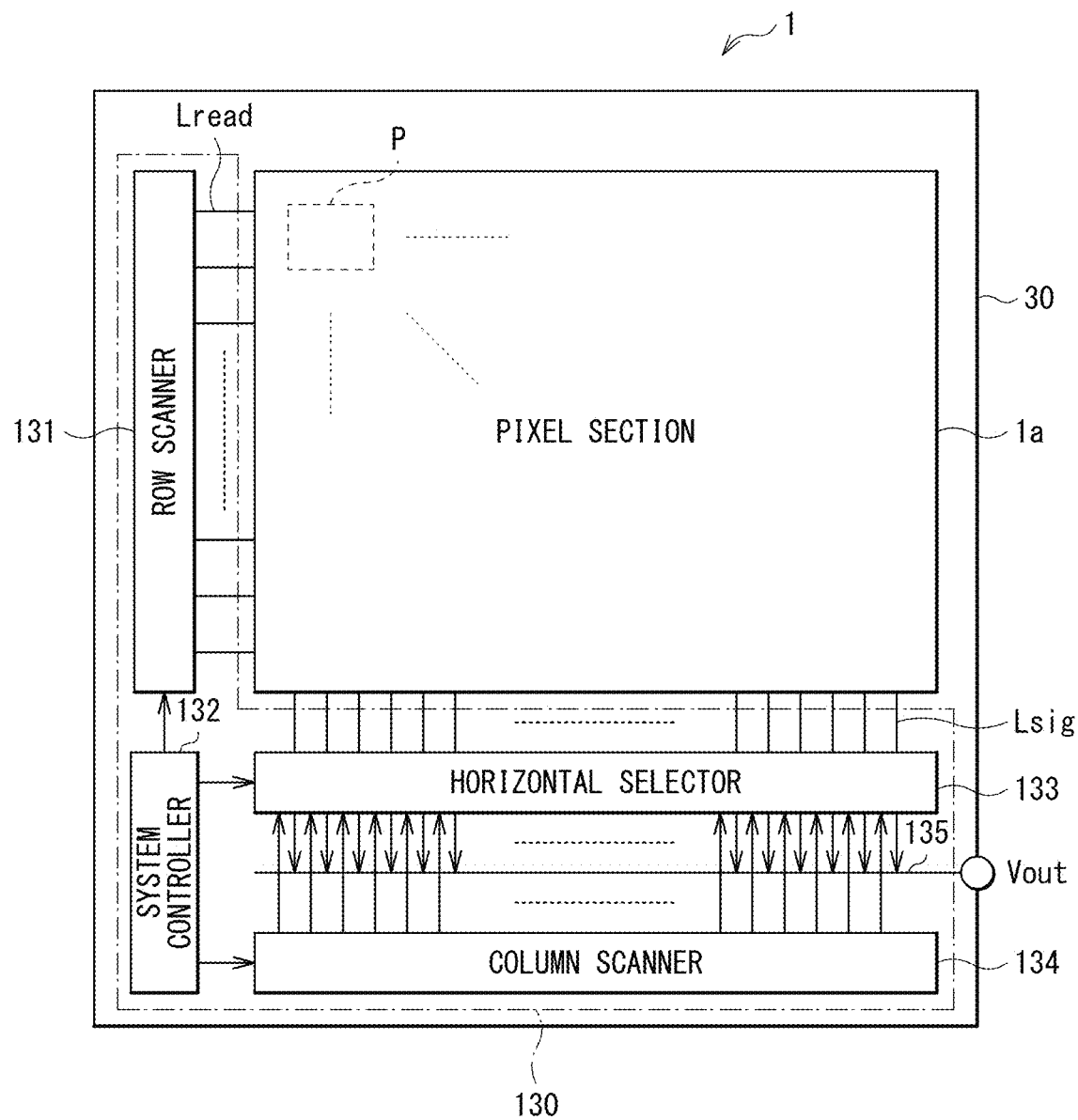
[FIG. 16]

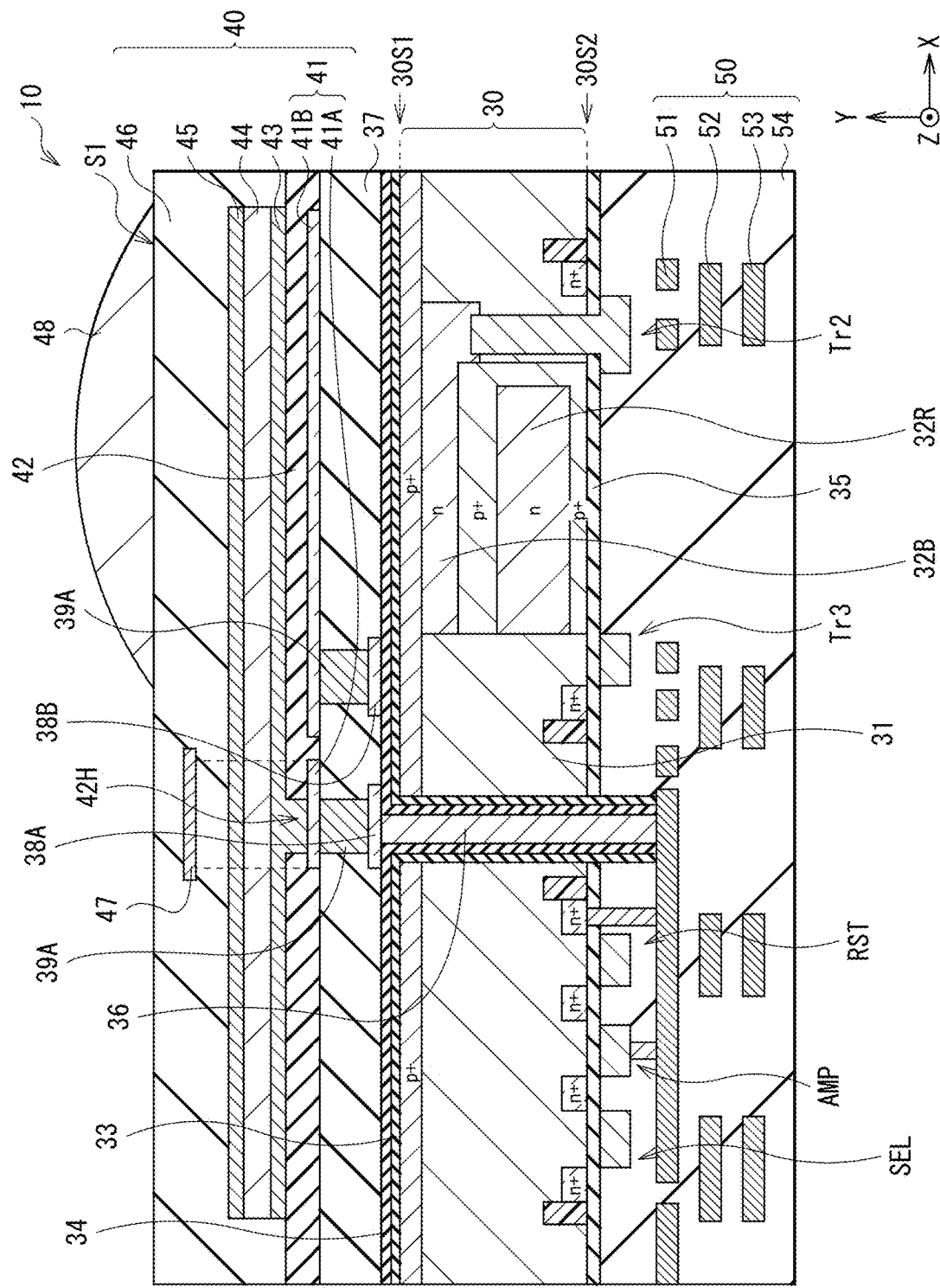
[FIG. 17]

[FIG. 18]
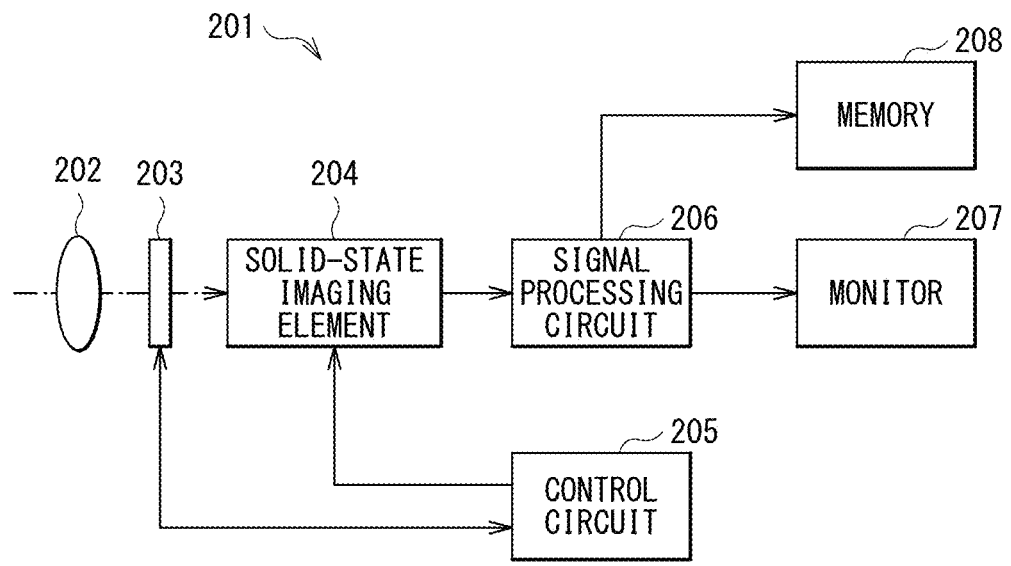
[FIG. 19]
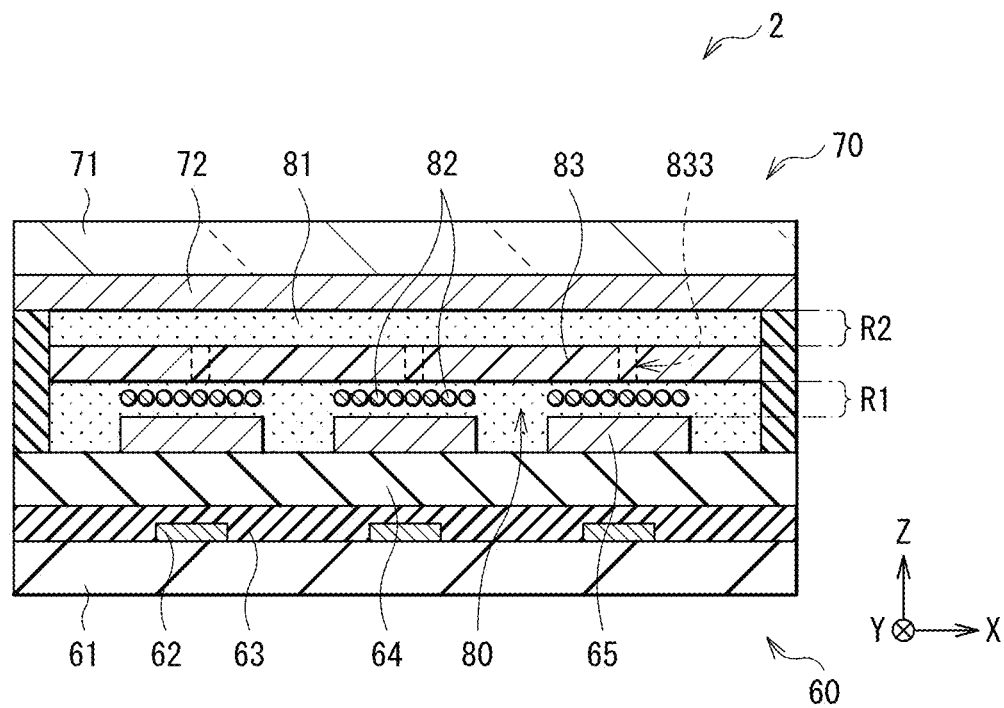

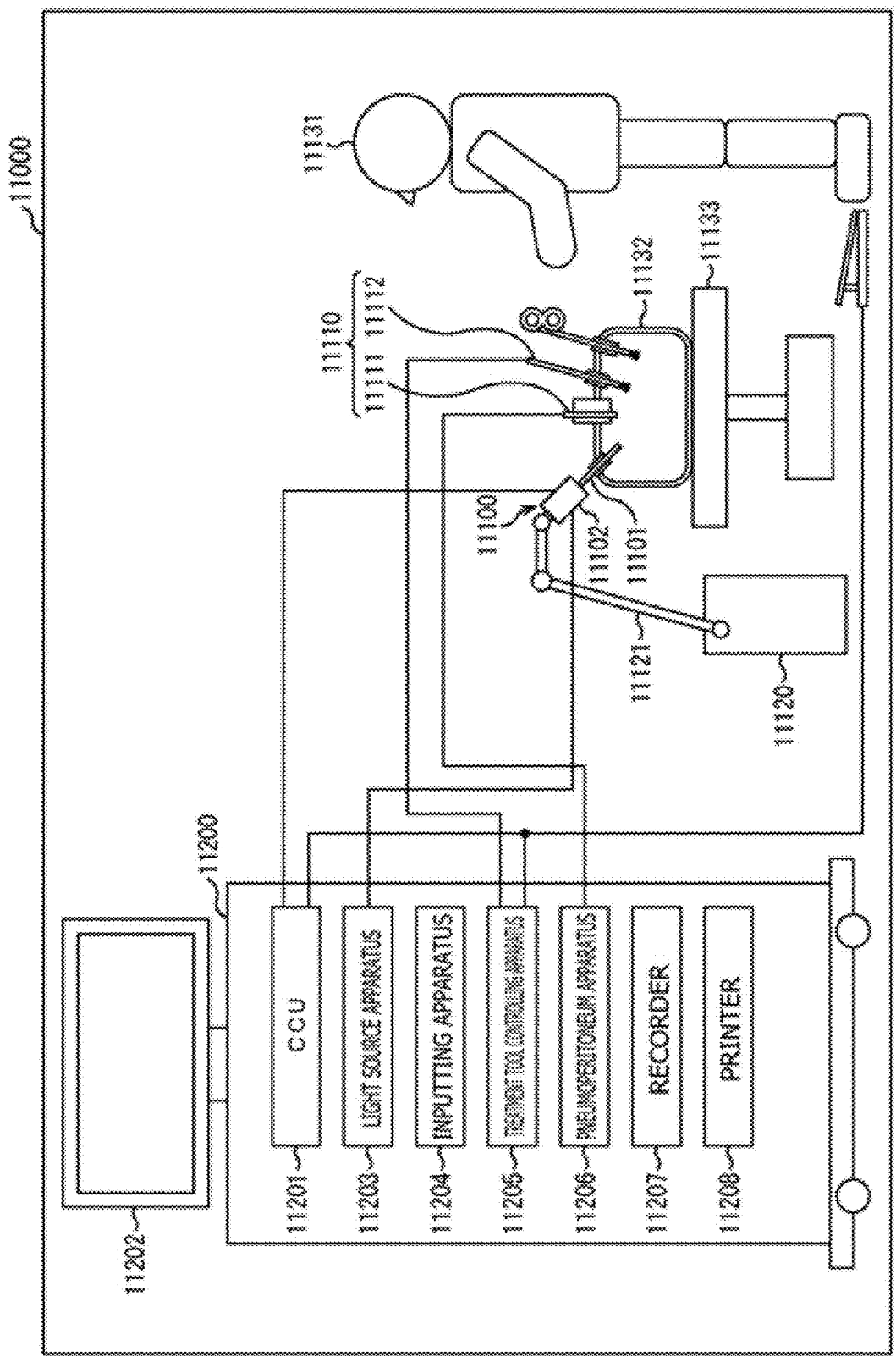
[FIG. 20]

[FIG. 21]
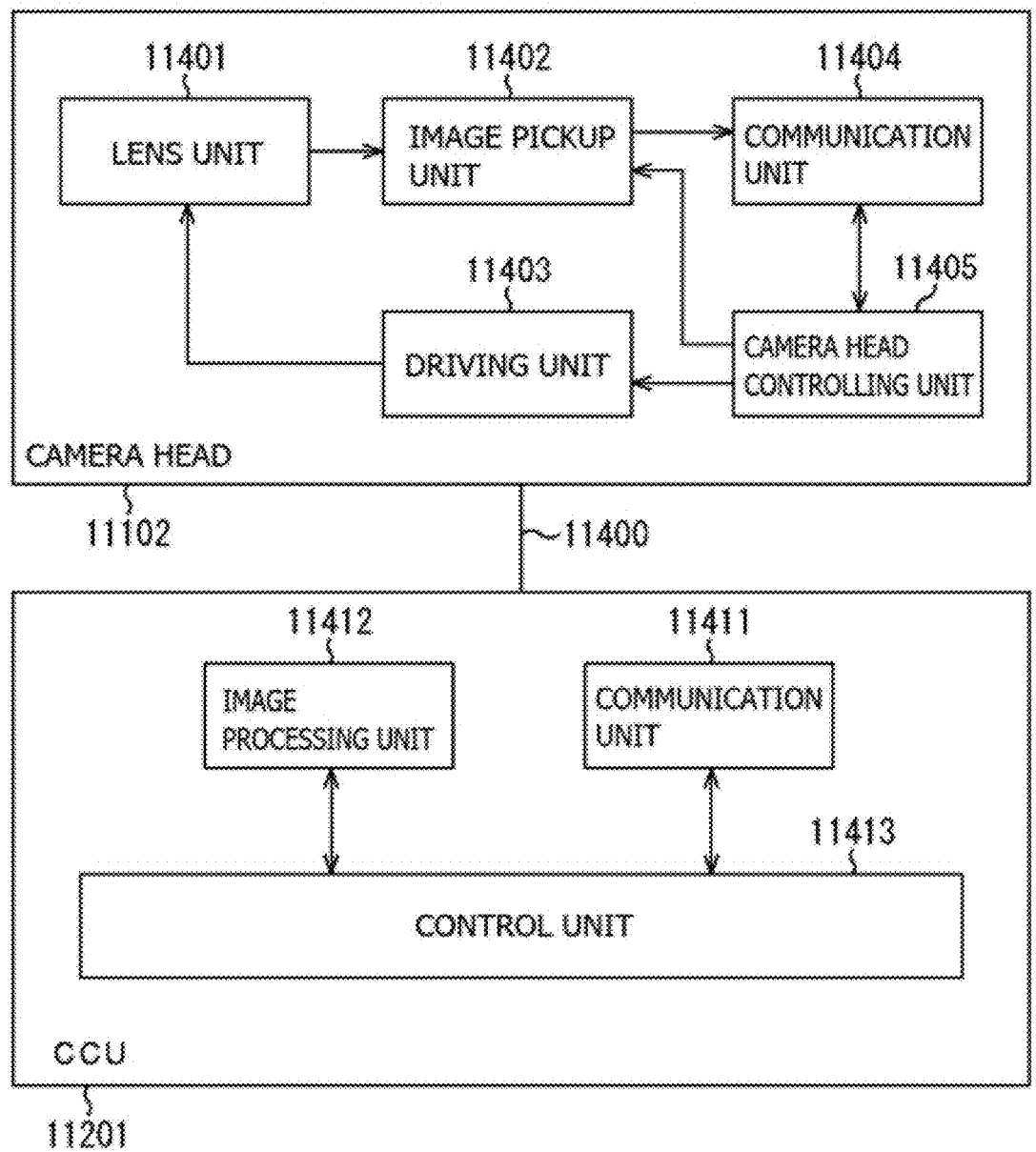

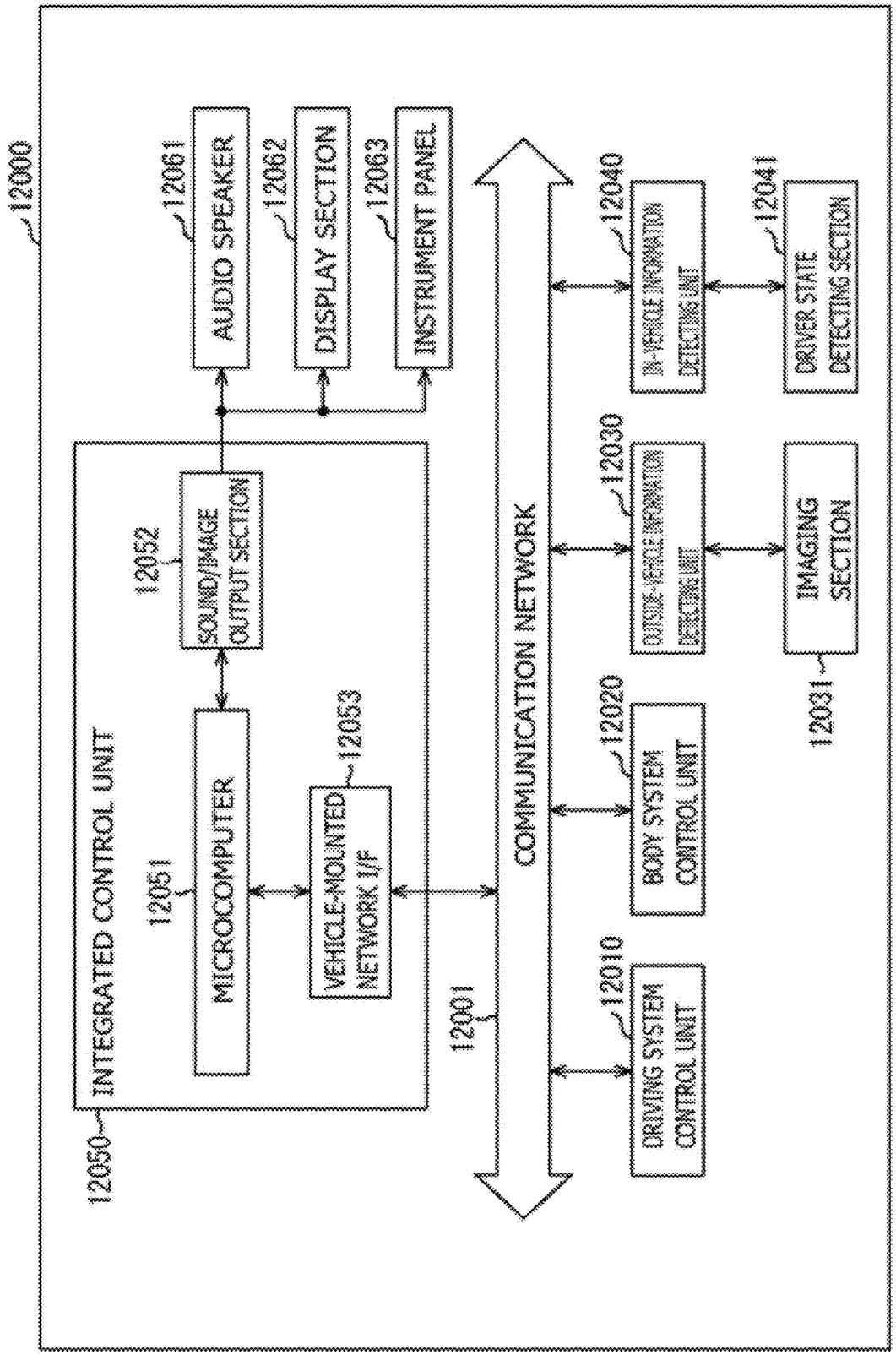
[FIG. 22]

[FIG. 23]
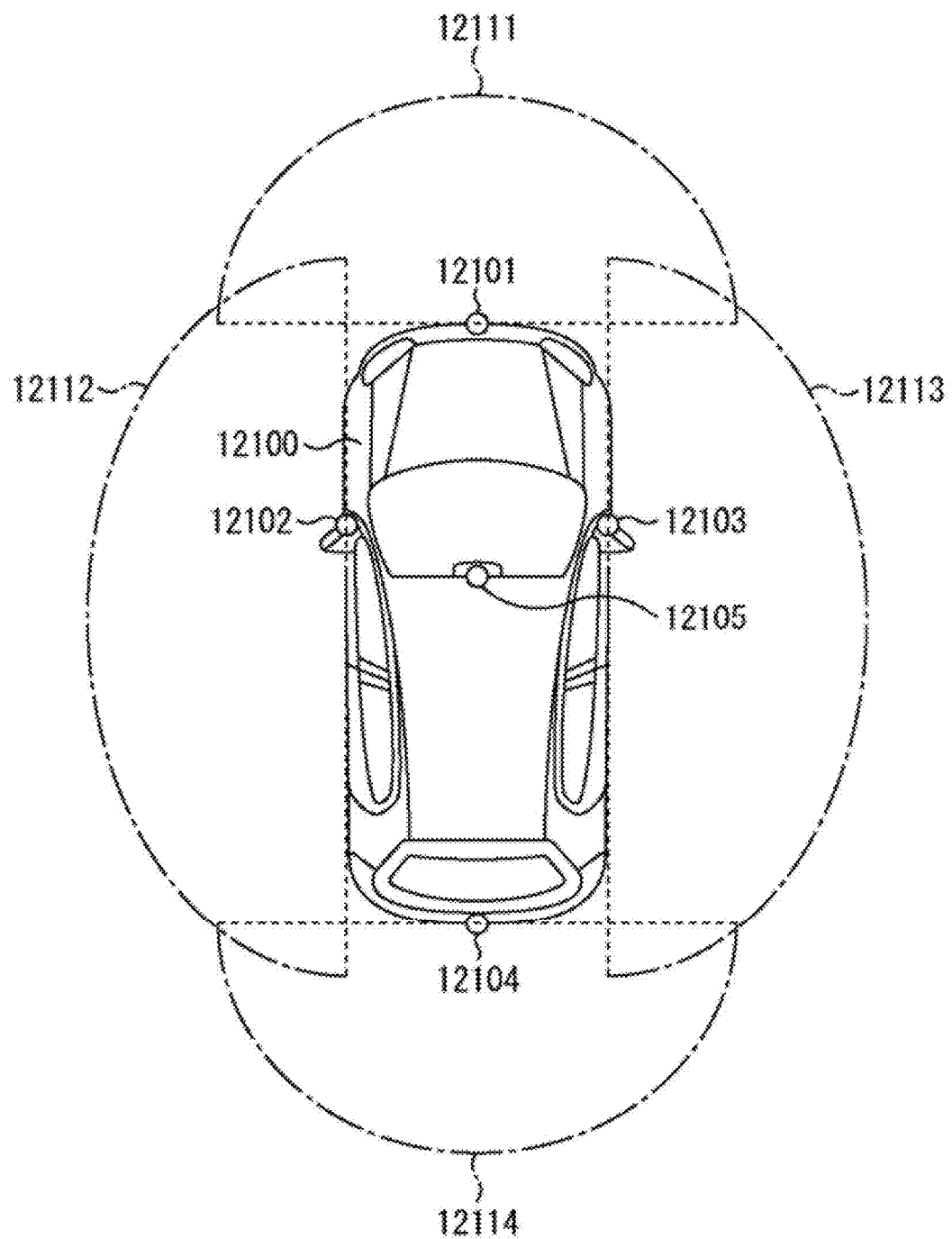

ETCHING METHOD OF OXIDE SEMICONDUCTOR FILM, OXIDE SEMICONDUCTOR WORKPIECE, AND ELECTRONIC DEVICE

CROSS REFERENCE TO RELATED APPLICATIONS

This application is a U.S. National Phase of International Patent Application No. PCT/JP2019/015555 filed on Apr. 10, 2019, which claims priority benefit of Japanese Patent Application No. JP 2018-089982 filed in the Japan Patent Office on May 8, 2018 and Japanese Patent Application No. JP 2019-003233 filed in the Japan Patent Office on Jan. 11, 2019. Each of the above-referenced applications is hereby incorporated herein by reference in its entirety.

TECHNICAL FIELD

The present disclosure relates to an etching method of an oxide semiconductor film used for an electrode or the like, an oxide semiconductor workpiece, and an electronic device.

BACKGROUND ART

For example, as an etching method of a silicon nitride (SiN) film, NPTL 1 reports an etching method in which a modified layer is formed on a surface by hydrogen plasma irradiation, and thereafter the modified layer is removed by fluorine radical irradiation.

CITATION LIST

Non-Patent Literature

NPTL 1: Sonam D. Sherpa and Alok Ranjan. J. Vac. Sci. Technol. A35 01A102 (2017)

SUMMARY OF THE INVENTION

Incidentally, in etching of an oxide semiconductor film, an improvement in processing speed is demanded. In addition, development is demanded of an etching method that causes less deterioration in device characteristics after etching.

It is desirable to provide an etching method of an oxide semiconductor film that makes it possible to improve processing speed of the oxide semiconductor film. In addition, it is desirable to provide an etching method that causes less deterioration in device characteristics after etching, an oxide semiconductor workpiece, and an electronic device.

A first etching method of an oxide semiconductor film according to an embodiment of the present disclosure includes: forming a reduction layer in an oxide semiconductor film with use of a reducing gas; and sputtering the reduction layer with use of a rare gas.

In the first etching method of the oxide semiconductor film according to the embodiment of the present disclosure, the reduction layer is formed in the oxide semiconductor film with use of the reducing gas, and the reduction layer is sputtered with use of the rare gas. Thus, a layer (reduction layer) that has high etching speed and is rich in a metal element is formed in the surface of the oxide semiconductor film.

A second etching method of an oxide semiconductor film according to an embodiment of the present disclosure includes: using a first gas containing hydrogen (H) and a second gas containing oxygen (O); and converting each of the first gas and the second gas into plasma and sputtering an oxide semiconductor film.

An oxide semiconductor workpiece according to an embodiment of the present disclosure has no change in composition and a different grain boundary density between at least a portion of a surface and its vicinity of an oxide semiconductor film, and an inner portion of the oxide semiconductor film.

An electronic device according to an embodiment of the present disclosure includes the above-described oxide semiconductor workpiece according to the embodiment of the present disclosure.

In the second etching method of the oxide semiconductor film according to the embodiment of the present disclosure, the oxide semiconductor workpiece according to the embodiment of the present disclosure, and the electronic device according to the embodiment of the present disclosure, the first gas containing hydrogen (H) and the second gas containing oxygen (O) are used, each of the first gas and the second gas is converted into plasma, and the oxide semiconductor film is sputtered, thereby suppressing change in composition of the oxide semiconductor film before and after etching.

BRIEF DESCRIPTION OF THE DRAWINGS

FIG. 1A is a schematic cross-sectional view for describing an etching method of an oxide semiconductor film according to a first embodiment of the present disclosure.

FIG. 1B is a schematic cross-sectional view of a process subsequent to FIG. 1A.

FIG. 1C is a schematic cross-sectional view of a process subsequent to FIG. 1B.

FIG. 2 is a characteristic diagram illustrating change in film composition before and after typical etching.

FIG. 3A is a schematic view of a TEM image of an ITO film after H2 plasma irradiation.

FIG. 3B illustrates composition ratios of In and O in A and B illustrated in FIG. 3A.

FIG. 4A is a schematic view for describing change in film composition of an oxide semiconductor film by reducing gas irradiation.

FIG. 4B is a schematic view for describing change in film composition of the oxide semiconductor film by the reducing gas irradiation subsequent to FIG. 4A.

FIG. 4C is a schematic view for describing change in film composition of the oxide semiconductor film by the reducing gas irradiation subsequent to FIG. 4B.

FIG. 5A is a schematic cross-sectional view for describing an etching method of an oxide semiconductor film according to a second embodiment of the present disclosure.

FIG. 5B is a schematic cross-sectional view of a process subsequent to FIG. 5A.

FIG. 6A is a schematic cross-sectional view of a process of etching an oxide semiconductor film according to a third embodiment.

FIG. 6B is a schematic cross-sectional view of a process subsequent to FIG. 6A.

FIG. 6C is a schematic cross-sectional view of a process subsequent to FIG. 6B.

FIG. 7A is a schematic cross-sectional view for describing an etching method of an oxide semiconductor film according to a fourth embodiment of the present disclosure.

FIG. 7B is a schematic cross-sectional view of a process subsequent to FIG. 7A.

FIG. 7C is a schematic cross-sectional view of a process subsequent to FIG. 7B.

FIG. 8 is a characteristic diagram illustrating change in oxygen concentration with respect to a depth of an oxide semiconductor film by irradiation time with a hydrogen gas.

FIG. 9 illustrates change in each ion concentration in a depth direction in a case where an oxide semiconductor film is irradiated with oxygen ions and hydrogen ions.

FIG. 10 illustrates change in resistivity of an oxide semiconductor film after plasma irradiation.

FIG. 11 is a TEM image of an oxide semiconductor film after etching.

FIG. 12A is a schematic view of change in crystal grain boundaries by a dosage of an etching gas.

FIG. 12B is a schematic view of change in crystal grain boundaries by a dosage of the etching gas.

FIG. 12C is a schematic view of change in crystal grain boundaries by a dosage of the etching gas.

FIG. 13 is a characteristic diagram of XRD when not processed and after rare gas irradiation.

FIG. 14A is a schematic cross-sectional view for describing an etching method of an oxide semiconductor film according to a fifth embodiment of the present disclosure.

FIG. 14B is a schematic cross-sectional view of a process subsequent to FIG. 14A.

FIG. 15A is a schematic cross-sectional view of a process of etching an oxide semiconductor film according to a sixth embodiment.

FIG. 15B is a schematic cross-sectional view of a process subsequent to FIG. 15A.

FIG. 15C is a schematic cross-sectional view of a process subsequent to FIG. 15B.

FIG. 16 is a block diagram illustrating a configuration of an imaging element using the oxide semiconductor film processed with use of the etching method illustrated in FIGS. 1A, 1B, and 1C, and the like.

FIG. 17 is a schematic cross-sectional view of a photoelectric conversion element used in an imaging apparatus illustrated in FIG. 16.

FIG. 18 is an explanatory diagram of a configuration of an electronic apparatus using the imaging apparatus illustrated in FIG. 16.

FIG. 19 is a schematic cross-sectional view of a reflective display apparatus using the oxide semiconductor film processed with use of the etching method illustrated in FIGS. 1A, 1B, and 1C, and the like.

MODES FOR CARRYING OUT THE INVENTION

Embodiments of the present disclosure are described in detail below with reference to drawings. It is to be noted that description is given in the following order.

1. First Embodiment (an example of an etching method in which irradiation with a reducing gas and a rare gas is performed in this order)
   1-1. Etching Method of Oxide Semiconductor Film
   1-2. Workings and Effects
2. Second Embodiment (an example of an etching method in which irradiation with a mixture of a reducing gas and a rare gas is performed)
3. Third Embodiment (a specific example of an etching process)
4. Fourth Embodiment (an example of an etching method in which irradiation with a hydrogen-containing gas and an oxygen-containing gas is performed in this order)
   4-1. Etching Method of Oxide Semiconductor Film
   4-2. Configuration of Oxide Semiconductor Film after Etching
   4-3. Workings and Effects
5. Fifth Embodiment (an example of an etching method in which irradiation with a mixture of a hydrogen-containing gas and an oxygen-containing gas is performed)
6. Sixth Embodiment (a specific example of an etching process)
7. Application Examples 1. First Embodiment FIGS. 1A, 1B, and 1C are schematic cross-sectional views of processes of etching an oxide semiconductor film (an oxide semiconductor film 12) according to a first embodiment of the present disclosure. The oxide semiconductor film 12 is used for an electrode included in any of various displays such as a flat panel display and a touch panel and electronic devices such as a solar cell and a light emitting diode (LED), for example. In addition, the oxide semiconductor film 12 is also used for an electromagnetic shield, an anti-reflection film, and the like. An etching method according to the present disclosure is suitably used for patterning and the like of the oxide semiconductor film 12 included in an electrode, for example.

(1-1. Etching Method of Oxide Semiconductor Film)

In an etching method of the oxide semiconductor film 12 according to the present embodiment, a reduction layer 12M is formed in the oxide semiconductor film 12 by irradiation with a reducing gas G1, and thereafter sputtering is performed with use of a rare gas G2 to process the oxide semiconductor film 12 into a desired shape. The etching method of the oxide semiconductor film 12 is described below with use of FIGS. 1A, 1B, and 1C.

First, the oxide semiconductor film 12 is formed on a supporting base 11 with use of, for example, any of dry methods or any of wet methods, as illustrated in FIG. 1A. The dry methods include a physical vapor deposition method (a PVD method) and a chemical vapor deposition method (a CVD method). Film formation methods using the principle of the PVD method include a vacuum evaporation method using resistance heat or high-frequency heating, an EB (electron beam) evaporation method, various sputtering methods (a magnetron sputtering method or a high-frequency sputtering method), an ion plating method, a laser ablation method, a molecular beam epitaxy method, and a laser transfer method. Film formation methods using the principle of the CVD method include a plasma CVD method, a thermal CVD method, a metal-organic (MO) CVD method, and a photo-CVD method. The wet methods include an electroplating method, an electroless plating method, a spin coating method, an inkjet method, a spray coating method, a stamp method, a microcontact printing method, a flexographic printing method, an offset printing method, a gravure printing method, a dip method, and the like.

As described above, the oxide semiconductor film 12 is used as an electrode included in any of various devices, for example. Examples of specific materials include indium oxide, indium-tin oxide (ITO, including Sn-doped $In_2O_3$, crystalline ITO, and amorphous ITO), indium-zinc oxide (IZO) that is prepared by adding indium as a dopant to zinc oxide, indium-gallium oxide (IGO) that is prepared by adding indium as a dopant to gallium oxide, indium-gallium-zinc oxide (IGZO, $In—GaZnO_4$) that is prepared by adding indium and gallium as dopants to zinc oxide, indiumtin-zinc oxide (ITZO) that is prepared by adding indium and tin as dopants to zinc oxide, IFO (F-doped $In_2O_3$), tin oxide ($SnO_2$), ATO (Sb-doped $SnO_2$), FTO (F-doped $SnO_2$), zinc oxide (including ZnO doped with any other element), aluminum-zinc oxide (AZO) that is prepared by adding aluminum as a dopant to zinc oxide, gallium-zinc oxide (GZO) that is prepared by adding gallium as a dopant to zinc oxide, titanium oxide ($TiO_2$), niobium-titanium oxide (TNO) that is prepared by adding niobium as a dopant to titanium oxide, antimony oxide, a spinel-type oxide, and an oxide having a $YbFe_2O_4$ structure. In addition, the examples of the specific materials include a transparent electrode material having a base layer of gallium oxide, titanium oxide, niobium oxide, nickel oxide, or the like.

Subsequently, the reduction layer 12M is formed in the oxide semiconductor film 12 by irradiation with the reducing gas G1, as illustrated in FIG. 1B. The reducing gas G1 is used to cause reduction by desorbing oxygen from an oxide semiconductor to increase a metal concentration (an $In/In_2O_3$ ratio) of the oxide semiconductor film 12 from 1 at. % or less (a lower limit of In detected by XPS) that is the metal concentration before irradiation. As the reducing gas G1, there are a reducing gas containing hydrogen and a reducing gas not containing hydrogen. Examples of the reducing gas containing hydrogen include hydrogen ($H_2$), ammonia ($NH_3$), hydrogen sulfide ($H_2S$), hydrogen peroxide ($H_2O_2$), methane ($CH_4$), ethylene ($C_2H_4$), butane ($C_4H_{10}$), and diborane ($B_2H_6$). Examples of the reducing gas not containing hydrogen include sulfur dioxide ($SO_2$), nitric oxide (NO), nitrogen dioxide ($NO_2$), carbon monoxide (CO), silicon tetrachloride ($SiCl_4$), and boron trichloride ($BCl_3$).

In a case where a gas containing carbon (C) such as methane ($CH_4$) is used as the reducing gas G1, for example, the reducing gas G1 is preferably used at a plasma density of about 1E+10 $cm^{-3}$ or less, for example, but the plasma density is not limited thereto. Even the reducing gas G1 with a plasma density of higher than 1E+10 $cm^{-3}$ holds promise of increasing an etching rate. In a case where a gas not containing carbon (C) is used, the gas is preferably used under a relatively high density plasma condition that the plasma density is 1E+12 $cm^{-3}$ or less. It is to be noted that the reducing gas G1 may use one kind or a combination of two or more kinds of the gases described above.

Next, the reduction layer 12M is sputtered by irradiation with the rare gas G2. Thus, the reduction layer 12M is removed, and the oxide semiconductor film 12 is etched. The rare gas G2 is selected from helium (He), neon (Ne), argon (Ar), krypton (Kr), and xenon (Xe). The rare gas G2 may use one kind or a combination of two or more kinds of the gases described above. After etching, for example, oxygen ($O_2$)-containing plasma post-treatment (for example, ashing treatment), wet cleaning, heat treatment, or the like is preferably performed.

(1-2. Workings and Effects)

In a case where an oxide semiconductor film such as ITO or IGZO is etched with use of hydrogen plasma, there is an issue that the composition of the oxide semiconductor film is changed over time and characteristics of a device using the oxide semiconductor film are deteriorated.

FIG. 2 illustrates results of measuring, with use of X-ray photoelectron spectroscopy (XPS), a ratio of In in an ITO film before and after etching using $H_2$/Ar plasma under a measurement condition of In $3d_{5/2}$. It can be seen that In—In bonding is increased in the ITO film after $H_2$/Ar plasma irradiation, as compared with the ITO film before the $H_2$/Ar plasma irradiation.

FIG. 3A schematically illustrates a TEM image after $H_2$ plasma irradiation of an ITO film 1012 formed on a substrate 1011. In a case where an oxide semiconductor film such as ITO is irradiated with $H_2$ plasma, a bump-like modified layer is formed on a surface of the oxide semiconductor film, as illustrated in FIG. 3A. FIG. 3B illustrates results of measuring In and O concentrations of a modified layer portion (A) and an ITO film portion (B) other than the modified layer portion illustrated in FIG. 3A with use of energy-dispersive X-ray spectrometry (EXD). It can be seen that the In concentration is high in the modified layer portion (A), as compared with that in the ITO film portion (B) other than the modified layer, and the modified layer is formed by aggregation of In.

Thus, in a case where the oxide semiconductor film is etched with use of hydrogen plasma, for example, O atoms are desorbed from ITO in the ITO film by entry of H atoms, which causes a surface to become In-rich. In the oxide semiconductor film of which the surface becomes In-rich, for example, an insulation property is reduced. The oxide semiconductor is used as an electrode material of the device as described above; however, for example, in a case where an upper electrode and a lower electrode that are opposed to each other with a display layer interposed therebetween each include the oxide semiconductor film, and the oxide semiconductor film is etched with use of hydrogen plasma as described above, change in the composition of the oxide semiconductor film as described above causes a short circuit between the upper electrode and the lower electrode.

In contrast, in the present embodiment, the reduction layer 12M is formed in the oxide semiconductor film 12 with use of the reducing gas G1, and thereafter the reduction layer 12M is sputtered by irradiation with the rare gas G2.

FIGS. 4A, 4B, and 4C are schematic views for describing change in film composition of the oxide semiconductor film 12 by reducing gas irradiation. In the present embodiment, as illustrated in FIG. 4A, the oxide semiconductor film 12 is irradiated with for example, carbon monoxide (CO) plasma as a reducing gas. Thus, in the oxide semiconductor film 12, as illustrated in FIG. 4B, CO deprives oxygen (O) from the oxide semiconductor to produce carbon dioxide (CO2), and the reduction layer 12M is formed in the surface of the oxide semiconductor film 12. The reduction layer 12M is a region in which the oxygen concentration becomes, by desorption of O from the oxide semiconductor, 50% or less of the oxygen concentration of the oxide semiconductor film before irradiation with the reducing gas as described above, and is a region that is rich in an metal element. This makes it possible to improve sputtering rate of the oxide semiconductor film 12 by the rare gas G2.

As described above, in the etching method of the oxide semiconductor film 12 according to the present embodiment of the present embodiment, the metal-rich reduction layer 12M is formed in the oxide semiconductor film 12 with use of the reducing gas G1, and thereafter the reduction layer 12M is sputtered by irradiation with the rare gas G2. This makes it possible to improve processing speed of the oxide semiconductor film 12.

In addition, dry etching is performed inside an etching apparatus; however, in a case where formation of the modified layer by hydrogen ($H_2$) and sputtering by the rare gas are performed as described above, for example, silicon (Si) used for an upper top plate in the apparatus during $H_2$ treatment is sputtered by $H_2$. A sputtered matter of Si sputtered by $H_2$ is deposited on a surface of a metal oxide film, which may affect stable processing.

In contrast, in the present embodiment, sulfur dioxide (SO$_2$), nitric oxide (NO), nitrogen dioxide (NO$_2$), carbon monoxide (CO), silicon tetrachloride (SiCl$_4$), boron trichloride (BCl$_3$) and the like, which do not contain hydrogen, are used as the reducing gas, which makes it possible to suppress sputtering of Si inside the etching apparatus and prevent deposition of the sputtered matter on the oxide semiconductor film 12. This makes it possible to improve processing stability of the oxide semiconductor film 12.

It is to be noted that in the present embodiment, an example of an etching method in which two processes of forming the reduction layer 12M by irradiation with the reducing gas G1, and thereafter sputtering the reduction layer 12M by irradiation with the rare gas G2 are performed has been described as the etching method of the oxide semiconductor film 12; however, the etching method is not limited thereto. For example, formation and sputtering of the reduction layer 12M may be repeated by alternate irradiation with the reducing gas G1 and the rare gas G2. This makes it easy to control a thickness of the reduction layer 12M, which makes it possible to improve processing accuracy.

Second to sixth embodiments of the present disclosure are described below. It is to be noted that the same components as those of the first embodiment described above are denoted by same reference numerals, and description thereof is omitted.

2. Second Embodiment

FIGS. 5A and 5B are schematic cross-sectional views of processes of etching an oxide semiconductor film (the oxide semiconductor film 12) according to the second embodiment of the present disclosure. In an etching method of the oxide semiconductor film 12 according to the present embodiment, a mixture of the reducing gas G1 and the rare gas G2 is used to perform formation and sputtering of the reduction layer 12M of the oxide semiconductor film 12 by one process. The etching method of the oxide semiconductor film 12 is described below with use of FIGS. 5A and 5B.

First, as illustrated in FIG. 5A, the oxide semiconductor film 12 is formed on the supporting base 11 with use of the method described above. Subsequently, as illustrated in FIG. 5B, the oxide semiconductor film 12 is irradiated with a mixture gas prepared by mixing the reducing gas G1 and the rare gas G2 at a volume ratio of 1:10 to 9:10 (the reducing gas G1:the rare gas G2), for example. Thus, formation of the reduction layer 12M in the oxide semiconductor film 12 and removal of the reduction layer 12M by sputtering are performed in one process.

As with the first embodiment described above, examples of the reducing gas containing hydrogen as the reducing gas G1 include hydrogen (H$_2$), ammonia (NH$_3$), hydrogen sulfide (H$_2$S), hydrogen peroxide (H$_2$O$_2$), ethylene (C$_2$H$_4$), butane (C$_4$H$_{10}$), and diborane (B$_2$H$_6$). Examples of the reducing gas not containing hydrogen include sulfur dioxide (SO$_2$), nitric oxide (NO), nitrogen dioxide (NO$_2$), carbon monoxide (CO), silicon tetrachloride (SiCl$_4$), and boron trichloride (BCl$_3$). As with the first embodiment described above, examples of the rare gas G2 include helium (He), neon (Ne), argon (Ar), krypton (Kr), and xenon (Xe).

A combination of the reducing gas G1 and the rare gas G2 is not specifically limited, and examples of the combination include combinations such as H$_2$/Ar, H$_2$/Xe, CO/Ar, and CO/Xe. In a case where the mixture of the reducing gas G1 and the rare gas G2 is used as with the present embodiment, it is preferable to use the reducing gas G1 under the following conditions. In a case where, for example, a gas containing carbon (C) such as methane (CH$_4$) is used as the reducing gas G1, the gas is preferably used at a plasma density of about 1E+10 cm$^{-3}$ or less, for example. It is to be noted that even the reducing gas G1 with a plasma density of higher than 1E+10 cm$^{-3}$ holds promise of increasing an etching rate. In a case where a gas not containing carbon (C) is used, the gas is preferably used under a relatively high density plasma condition that the plasma density is 1E+12 cm$^{-3}$ or less. It is to be noted that the reducing gas G1 may use one kind or a combination of two or more kinds of the gases described above. In addition, the mixture gas used in the process of etching the oxide semiconductor film 12 described above may use a combination of two or more kinds of rare gases as the reducing gas G1 described above and two or more kinds of rare gases as the rare gas G2 described above.

As described above, in the etching method of the oxide semiconductor film 12 according to the present embodiment, the oxide semiconductor film 12 is irradiated with the mixture of the reducing gas G1 and the rare gas G2, which makes it possible to perform formation and sputtering of the reduction layer 12M by one process. Accordingly, an effect of simplifying the etching processes is achieved in addition to effects in the first embodiment described above.

3. Third Embodiment

FIGS. 6A, 6B, and 6C are schematic cross-sectional views of processes of etching an oxide semiconductor film (the oxide semiconductor film 12) according to the third embodiment of the present disclosure. The etching method of the oxide semiconductor film 12 according to the present disclosure is used for various devices, an electromagnetic shield, an anti-reflection film, and the like as described above. In relation to displays, the etching method is suitably used for processing of electrodes, thin film transistors (TFT), and color filters included in TN (Twist Nematic) type and STN (Super Twist Nematic) type liquid crystal displays, an OLED (Organic Light Emitting Diode), a PDP (Plasma Display Panel), an FED (Field Emission Display), and an electronic paper. An example of a specific etching method of the oxide semiconductor film 12 is described below with use of FIGS. 6A, 6B, and 6C.

First, as illustrated in FIG. 6A, a resist film 21 patterned into a predetermined shape is formed on the oxide semiconductor film 12 formed on the supporting base 11. Subsequently, as illustrated in FIG. 6B, irradiation with the reducing gas G1 is performed. This causes the reducing gas G1 to enter into the oxide semiconductor film 12 exposed from an opening 21H formed in the resist film 21, thereby forming the reduction layer 12M. Next, as illustrated in FIG. 6C, the reduction layer 12M is sputtered by irradiation with the rare gas G2. Thus, the reduction layer 12M is etched to form an opening 12H in the oxide semiconductor film 12.

It is to be noted that, as described above, the reduction layer 12M is a metal atom-rich region in which the oxygen concentration becomes 50% or less of the oxygen concentration of another region by desorption of oxygen atoms (O). The reduction layer 12M exists in a side surface of a pattern formed by etching, and even in a bottom surface of an opening formed by etching in a case where etching is stopped in progress.

As described above, the resist film 21 patterned into a desired shape is formed on the oxide semiconductor film 12, and thereafter formation of the reduction layer 12M in the oxide semiconductor film 12 and sputtering of the reduction layer 12M are performed with use of the reducing gas G1 and the rare gas G2. This makes it possible to improve processing speed of the oxide semiconductor film 12.

It is to be noted that in the first to third embodiments described above, a film to be etched is the oxide semiconductor film; however, the etching method according to the present disclosure is applicable to a metal oxide film. Examples of metal oxides include magnetite ($Fe_3O_4$), alumina ($Al_2O_3$), titania ($TiO_2$), zirconia ($ZrO_2$), tantalum pentoxide ($Ta_2O_5$), hafnia ($Hf_2O_3$), and magnesium oxide (MgO). Using the etching method according to the present disclosure for processing of the metal oxide film makes it possible to control a processed film thickness of the metal oxide film and microfabricate the metal oxide film.

4. Fourth Embodiment

FIGS. 7A, 7B, and 7C are schematic cross-sectional views of processes of etching an oxide semiconductor film (the oxide semiconductor film 12) according to the fourth embodiment of the present disclosure. The oxide semiconductor film 12 is used for an electrode included in any of various displays such as a flat panel display and a touch panel and electronic devices such as a solar cell and a light emitting diode (LED), for example. In addition, the oxide semiconductor film 12 is also used for an electromagnetic shield, an anti-reflection film, and the like. The etching method according to the present disclosure is suitably used for patterning and the like of the oxide semiconductor film 12 included in an electrode, for example.

(4-1. Etching Method of Oxide Semiconductor Film)

In an etching method of the oxide semiconductor film 12 according to the present embodiment, the oxide semiconductor film 12 is irradiated with a hydrogen (H)-containing gas G3 (a first gas) and an oxygen (O)-containing gas G4 (a second gas), which are converted into plasma, in this order to process the oxide semiconductor film 12 into a desired shape. Specifically, the reduction layer 12M is formed in the oxide semiconductor film 12 by irradiation with the hydrogen-containing gas G3, and thereafter sputtering is performed by irradiation with the oxygen-containing gas G4 to pattern the oxide semiconductor film 12 and oxidize the reduction layer 12M, thereby forming a grain boundary layer 12G in a sputtered surface and its vicinity. The etching method of the oxide semiconductor film 12 is described below with use of FIGS. 7A, 7B, and 7C.

First, the oxide semiconductor film 12 is formed on the supporting base 11 with use of, for example, any of dry methods or any of wet methods, as illustrated in FIG. 7A. The dry methods include a physical vapor deposition method (a PVD method) and a chemical vapor deposition method (a CVD method). Film formation methods using the principle of the PVD method include a vacuum evaporation method using resistance heat or high-frequency heating, an EB (electron beam) evaporation method, various sputtering methods (a magnetron sputtering method or a high-frequency sputtering method), an ion plating method, a laser ablation method, a molecular beam epitaxy method, and a laser transfer method. Film formation methods using the principle of the CVD method include a plasma CVD method, a thermal CVD method, a metal-organic (MO) CVD method, and a photo-CVD method. The wet methods include an electroplating method, an electroless plating method, a spin coating method, an inkjet method, a spray coating method, a stamp method, a microcontact printing method, a flexographic printing method, an offset printing method, a gravure printing method, a dip method, and the like.

As described above, the oxide semiconductor film 12 is used as an electrode included in any of various devices, for example. Examples of specific materials include indium oxide, indium-tin oxide (ITO, including Sn-doped $In_2O_3$, crystalline ITO, and amorphous ITO), indium-zinc oxide (IZO) that is prepared by adding indium as a dopant to zinc oxide, indium-gallium oxide (IGO) that is prepared by adding indium as a dopant to gallium oxide, indium-gallium-zinc oxide (IGZO, In—$GaZnO_4$) that is prepared by adding indium and gallium as dopants to zinc oxide, indium-tin-zinc oxide (ITZO) that is prepared by adding indium and tin as dopants to zinc oxide, IFO (F-doped $In_2O_3$), tin oxide ($SnO_2$), ATO (Sb-doped $SnO_2$), FTO (F-doped $SnO_2$), zinc oxide (including ZnO doped with any other element), aluminum-zinc oxide (AZO) that is prepared by adding aluminum as a dopant to zinc oxide, gallium-zinc oxide (GZO) that is prepared by adding gallium as a dopant to zinc oxide, titanium oxide ($TiO_2$), niobium-titanium oxide (TNO) that is prepared by adding niobium as a dopant to titanium oxide, antimony oxide, a spinel-type oxide, and an oxide having a $YbFe_2O_4$ structure. In addition, the examples of the specific materials include a transparent electrode material having a base layer of gallium oxide, titanium oxide, niobium oxide, nickel oxide, or the like.

Subsequently, the reduction layer 12M is formed in the oxide semiconductor film 12 by irradiation with the hydrogen-containing gas G3, as illustrated in FIG. 7B. The hydrogen-containing gas G3 is used to cause reduction by desorbing oxygen from an oxide semiconductor to increase a metal concentration (an $In/In_2O_3$ ratio) of the oxide semiconductor film 12 from 1 at. % or less (a lower limit of In detected by XPS) that is the metal concentration before irradiation. Examples of the hydrogen-containing gas G3 include hydrogen ($H_2$), ammonia ($NH_3$), hydrogen sulfide ($H_2S$), hydrogen peroxide ($H_2O_2$), diborane ($B_2H_6$), and a hydrocarbon gas containing carbon (C) and hydrogen (H) at least in a molecule. Examples of specific hydrocarbon gases include methane ($CH_4$), ethylene ($C_2H_4$), and butane ($C_4H_{10}$).

In a case where a gas containing carbon (C) such as methane ($CH_4$) is used as the hydrogen-containing gas G3, for example, the hydrogen-containing gas G3 is preferably used at a plasma density of about $1E+10$ $cm^{-3}$ or less, for example, but the plasma density is not limited thereto. Even the hydrogen-containing gas G3 with a plasma density of higher than $1E+10$ $cm^{-3}$ holds promise of increasing an etching rate. In a case where a gas not containing carbon (C) is used, the gas is preferably used under a relatively high density plasma condition that the plasma density is $1E+12$ $cm^{-3}$ or less. It is to be noted that the hydrogen-containing gas G3 may use one kind or a combination of two or more kinds of the gases described above.

Next, the reduction layer 12M is sputtered by irradiation with the oxygen-containing gas G4, as illustrated in FIG. 7C. Thus, at least a portion of the reduction layer 12M is removed, and the oxide semiconductor film 12 is etched. In addition, in irradiation with the oxygen-containing gas G4, the reduction layer 12M is oxidized by irradiation with the oxygen-containing gas G4 simultaneously with sputtering of the reduction layer 12M. This causes a composition inside the reduction layer 12M to be recovered to the same composition as a composition in a region other than the reduction layer 12M such as an inner portion of the oxide semiconductor film 12. Furthermore, a region (the grain boundary layer 12G) having more crystal grain boundaries than the inner portion of the oxide semiconductor film 12 is formed in the sputtered surface and its vicinity of the oxide semiconductor film 12.

Examples of the oxygen-containing gas G4 include oxygen ($O_2$), sulfur dioxide ($SO_2$), nitric oxide (NO), nitrogen dioxide ($NO_2$), carbon monoxide (CO), carbon dioxide ($CO_2$), and the like. It is to be noted that it is sufficient if the oxygen-containing gas G4 contains an oxygen (O) atom in a molecule, and the oxygen-containing gas G4 is not limited to the gases described above. The oxygen-containing gas G4 is preferably used at a plasma density of about $1E+10$ cm$^{-3}$ or less, for example, but the plasma density is not limited thereto. Even the oxygen-containing gas G4 with a plasma density of higher than $1E+10$ cm$^{-3}$ holds promise of increasing an etching rate. It is to be noted that the oxygen-containing gas G4 may use one kind or a combination of two or more kinds of the gases described above.

Furthermore, irradiation with the hydrogen-containing gas G3 and irradiation with the oxygen-containing gas G4 may be alternately repeated. In a case where an oxide semiconductor in the sputtered surface is excessively oxidized by irradiation with the oxygen-containing gas G4, an excess of oxygen (O) is removed as $OH_x$ by irradiation with the hydrogen-containing gas G3 that is to be next performed. After etching, for example, oxygen ($O_2$)-containing plasma post-treatment (for example, ashing treatment), wet cleaning, heat treatment, or the like is preferably performed.

(4-2. Configuration of Oxide Semiconductor Film after Etching)

In the oxide semiconductor film 12 formed with use of the etching method described above, the grain boundary layer 12G is formed in a surface (a surface 12S1), which is the sputtered surface, and its vicinity. The grain boundary layer 12G has no change in composition as compared with the inner portion of the oxide semiconductor film 12, and has a large grain boundary density as compared with the inner portion of the oxide semiconductor film 12.

FIG. 8 illustrates results of analyzing change in oxygen concentration with respect to a depth direction of the oxide semiconductor film 12 (an ITO film as an example) by irradiation time with a hydrogen ($H_2$) gas as an example of the hydrogen-containing gas G3 described above. In a case where the oxide semiconductor film 12 is irradiated with the hydrogen gas, the oxygen concentration up to around 20 nm in the depth direction is decreased. For example, in a case where the oxide semiconductor film 12 is irradiated with the hydrogen gas for three seconds, the oxygen concentration in the oxide semiconductor film 12 is decreased by 48%. Accordingly, it can be seen that oxygen in the oxide semiconductor film 12 is desorbed by irradiation with the hydrogen-containing gas G3, and the reduction layer 12M is formed up to around 20 nm in the depth direction from the surface of the oxide semiconductor film 12.

FIG. 9 illustrates results of simulating change in oxygen ion concentration and hydrogen ion concentration in the depth direction in a case where the oxide semiconductor film 12 (an ITO film as an example) is irradiated with oxygen ions (a solid line) and hydrogen ions (a dotted line). As can be seen from FIG. 8, in a case where the oxide semiconductor film 12 is irradiated with only hydrogen ions (the hydrogen-containing gas G3) or only oxygen ions (the oxygen-containing gas G4), the composition of the oxide semiconductor film 12 is changed in the depth direction before and after irradiation. In addition, the hydrogen ions enter to a depth of about 20 nm, and in a case where irradiation with the hydrogen-containing gas G3 is performed, and thereafter irradiation with the oxygen-containing gas G4 is performed, the oxygen-containing gas G4 enters to the depth of about 20 nm to which the hydrogen ions have entered. Thus, the grain boundary layer 12G is formed from the sputtered surface and the side surface of the pattern formed by etching to a depth of about 20 nm.

FIG. 10 illustrates change in resistivity of the oxide semiconductor film 12 (an ITO film as an example) after irradiation with plasma of each element. It is to be noted that INI in FIG. 10 indicates resistivity of the ITO film that is not yet irradiated with plasma, and $O_2$ and $H_2$ respectively indicate results obtained by irradiation with only oxygen plasma and irradiation with only hydrogen plasma. In addition, $H_2 \rightarrow O_2$ indicates a result obtained in a case where irradiation with oxygen plasma is performed after irradiation with hydrogen plasma, $H_2 \rightarrow CO$ indicates a result obtained in a case where irradiation with carbon monoxide plasma is performed after irradiation with hydrogen plasma, and $H_2/CO$ indicates a result obtained in a case where irradiation with hydrogen plasma and irradiation with carbon monoxide plasma are performed simultaneously. As can be seen from FIG. 10, as compared with resistivity of the unprocessed ITO film, resistivity is changed in a case where each of irradiation with only hydrogen plasma and irradiation with only oxygen plasma is performed, whereas resistivity is substantially equal in a case where irradiation with the oxygen-containing gas G4 such as oxygen plasma and carbon monoxide plasma is performed after or simultaneously with irradiation with hydrogen plasma. That is, it is presumed that the composition of the oxide semiconductor film 12 is not changed by irradiation with the oxygen-containing gas G4 after or simultaneously with irradiation with the hydrogen-containing gas G3.

FIG. 11 is a TEM image of the semiconductor film 12 (an ITO film as an example) after etching, and makes it possible to confirm that a grain boundary density in a range from the surface (the surface 12S1) to 20 nm in the depth direction is different from a grain boundary density in the inner portion (for example, at a position deeper than 20 nm from the surface) of the oxide semiconductor film 12. FIGS. 12A, 12B, and 12C schematically illustrate change in crystal grain boundaries in a surface of an oxide semiconductor film by a dosage of the oxygen-containing gas G4. As can be seen from FIGS. 12A, 12B, and 12C, crystal grain boundaries in the surface of the oxide semiconductor film is increased with an increase in the dosage of the oxygen-containing gas G4. FIG. 13 illustrates results of X-ray diffraction (XRD) of the oxide semiconductor film 12 (an IZO film as an example) after rare gas (He+) treatment and an unprocessed IZO film. As can be seen from FIG. 13, the crystal grain boundaries in the oxide semiconductor film 12 are disordered by irradiation with helium (He+), and a width of a diffraction peak is increased. In addition, as can be seen from a Scherrer equation represented by the following expression (1), a crystal particle diameter is decreased from 21 nm to 15 nm. For this reason, it is conceivable that in the etching method of the oxide semiconductor film 12 according to the present embodiment, the crystal particle diameter is decreased by 6 nm or more, as compared with the crystal particle diameter before etching. It is to be noted that it is possible to measure crystal grain boundaries in the oxide semiconductor film 12 by spread of a peak by X-ray diffraction as with FIG. 13. In addition, as described later, in a case where the oxide semiconductor film 12 is patterned into a predetermined shape with use of the etching method according to the present embodiment and the oxide semiconductor film 12 in an etching region is completely removed, a grain boundary density similar to that in the sputtered surface described above remains in a side surface of the pattern. This makes it possible to perform observation by high resolution TEM.

As described above, in irradiation with the oxygen-containing gas G4 described above, oxygen (O) enters into a region (the reduction layer 12M) from which oxygen is desorbed by entry of hydrogen (H) to oxidize an oxide semiconductor in the reduction layer 12M again, thereby recovering the composition. Furthermore, the crystal particle diameter is decreased by this entry of oxygen (O) to increase the grain boundary density. That is, a region having a composition not different from the composition in the inner portion of the oxide semiconductor film 12, and having a larger grain boundary density than the inner portion of the oxide semiconductor film 12 is formed in a range within 20 nm from the sputtered surface (the surface 12S1) of the oxide semiconductor film 12.

(4-3. Workings and Effects)

In a case where the oxide semiconductor film such as ITO and IGZO is etched with use of hydrogen plasma, oxygen atoms are desorbed from the oxide semiconductor film over time by entry of hydrogen plasma. For example, as illustrated in FIGS. 2, 3A, and 3B, In—In bonding is increased in the ITO film after $H_2/Ar$ plasma irradiation, as compared with the ITO film before the $H_2/Ar$ plasma irradiation.

Thus, in a case where the oxide semiconductor film is etched with use of hydrogen plasma, for example, O atoms are desorbed from ITO in the ITO film by entry of H atoms, which causes a surface to become In-rich. In the oxide semiconductor film of which the surface becomes In-rich, for example, an insulation property is reduced. The oxide semiconductor is used as an electrode material of the device as described above; however, for example, in a case where an upper electrode and a lower electrode that are opposed to each other with a display layer interposed therebetween each include the oxide semiconductor film, and the oxide semiconductor film is etched with use of hydrogen plasma as described above, there is an issue that change in the composition of the oxide semiconductor film as described above causes a short circuit between the upper electrode and the lower electrode, thereby deteriorating characteristics of a device using the oxide semiconductor film. For this reason, development is demanded of an etching method that causes less deterioration in device characteristics after etching.

In contrast, in the present embodiment, the hydrogen-containing gas G3 and the oxygen-containing gas G4 are converted into plasma in order, and the oxide semiconductor film is sputtered. Specifically, the reduction layer 12M is formed in the oxide semiconductor film 12 with use of the hydrogen-containing gas G3, and thereafter the reduction layer 12M is sputtered by irradiation with the oxygen-containing gas G4. Thus, oxygen plasma enters into the reduction layer 12M by irradiation with the oxygen-containing gas G4 to recover the composition of the reduction layer 12M that has become In-rich by irradiation with the hydrogen-containing gas G3 to substantially the same composition as the composition of the inner portion of the oxide semiconductor film 12. This makes it possible to suppress change in the composition of the oxide semiconductor film 12 before and after etching.

As described above, in the etching method of the oxide semiconductor film 12 according to the present embodiment, the reduction layer 12M is formed in the oxide semiconductor film 12 with use of the hydrogen-containing gas G3, and thereafter the reduction layer 12M is sputtered by irradiation with the oxygen-containing gas G4; therefore, the composition of the reduction layer 12M is recovered to substantially the same composition of the inner portion of the oxide semiconductor film 12 by entry of oxygen plasma. That is, etching that causes less deterioration in characteristics after etching is possible.

In addition, a region (a grain boundary layer) 12G is formed, by entry of oxygen plasma, in the sputtered surface (for example, the surface 12S1) having been subjected to the etching method according to the present embodiment and its vicinity of the oxide semiconductor film 12. The region (the grain boundary layer) 12G has a composition not different from the composition of the inner portion of the oxide semiconductor film 12 and has a higher grain boundary density than the inner portion of the oxide semiconductor film 12.

Furthermore, in the present embodiment, irradiation with the hydrogen-containing gas G3 and irradiation with the oxygen-containing gas G4 are repeated, thereby removing an excess of oxygen (O) as $OH_x$ by irradiation with the hydrogen-containing gas G3 in a case where the oxide semiconductor film 12 is excessively oxidized by irradiation with the oxygen-containing gas G4. That is, it is possible to suppress excessive oxidization of the oxide semiconductor film 12 by the oxygen-containing gas G4.

5. Fifth Embodiment

FIGS. 14A and 14B are schematic cross-sectional views of processes of etching an oxide semiconductor film (the oxide semiconductor film 12) according to the fifth embodiment of the present disclosure. In an etching method of the oxide semiconductor film 12 according to the present embodiment, a mixture of the hydrogen (H)-containing gas G3 (the first gas) and the oxygen (O)-containing gas G4 (the second gas) is used to convert the hydrogen-containing gas G3 and the oxygen-containing gas G4 into plasma and perform sputtering of the oxide semiconductor film 12 by one process. The etching method of the oxide semiconductor film 12 is described below with use of FIGS. 14A and 14B.

First, as illustrated in FIG. 14A, the oxide semiconductor film 12 is formed on the supporting base 11 with use of the method described above. Subsequently, as illustrated in FIG. 7B, for example, irradiation with a mixture gas is performed. The mixture gas is prepared by mixing the hydrogen-containing gas G3 and the oxygen-containing gas G4 at a volume ratio of 10:90 to 95:5 (the hydrogen-containing gas G3:the oxygen-containing gas G4), for example. Thus, formation of the reduction layer 12M in the surface (the surface 12S1) and its vicinity of the oxide semiconductor film 12 by the hydrogen-containing gas G3, and sputtering of the reduction layer 12M and recovery of the composition of the reduction layer 12M by the oxygen-containing gas G4 are performed in one process.

As with the fourth embodiment described above, examples of the hydrogen-containing gas G3 include hydrogen ($H_2$), ammonia ($NH_3$), hydrogen sulfide ($H_2S$), hydrogen peroxide ($H_2O_2$), diborane ($B_2H_6$), and a hydrocarbon gas containing carbon (C) and hydrogen (H) at least in a molecule. Examples of a specific hydrocarbon gas include methane ($CH_4$), ethylene ($C_2H_4$), and butane ($C_4H_{10}$). Examples of the oxygen-containing gas G4 include oxygen ($O_2$), sulfur dioxide ($SO_2$), nitric oxide (NO), nitrogen dioxide ($NO_2$), carbon monoxide (CO), carbon dioxide ($CO_2$), and the like. It is to be noted that it is sufficient if the oxygen-containing gas G4 contains an oxygen (O) atom in a molecule, and the oxygen-containing gas G4 is not limited to the gases described above.

A combination of the hydrogen-containing gas G3 and the oxygen-containing gas G4 is not specifically limited, and examples of the combination include combinations such as $H_2/O_2$ and $H_2/CO$. It is to be noted that each of the hydrogen-containing gas G3 and the oxygen-containing gas G4 may use a combination of two or more kinds of rare gases.

As described above, in the etching method of the oxide semiconductor film 12 according to the present embodiment, the hydrogen-containing gas G3 and the oxygen-containing gas G4 are mixed and each converted into plasma, and the oxide semiconductor film 12 is irradiated with a mixture of the hydrogen-containing gas G3 and the oxygen-containing gas G4, which forms, by one process, the region (the grain boundary layer) 12G that has a composition not different from the composition of the inner portion of the oxide semiconductor film 12 and has a higher grain boundary density than the inner portion of the oxide semiconductor film 12. Accordingly, an effect of simplifying the etching processes is achieved in addition to effects in the fourth embodiment described above.

6. Sixth Embodiment

FIGS. 15A, 15B, and 15C are schematic cross-sectional views of processes of etching an oxide semiconductor film (the oxide semiconductor film 12) according to the sixth embodiment of the present disclosure. The etching method of the oxide semiconductor film 12 according to the present disclosure is used for various devices, an electromagnetic shield, an anti-reflection film, and the like as described above. In relation to displays, the etching method is suitably used for processing of electrodes, thin film transistors (TFT), and color filters included in TN (Twist Nematic) type and STN (Super Twist Nematic) type liquid crystal displays, an OLED (Organic Light Emitting Diode), a PDP (Plasma Display Panel), an FED (Field Emission Display), and an electronic paper. An example of a specific etching method of the oxide semiconductor film 12 is described below with use of FIGS. 15A, 15B, and 15C.

First, as illustrated in FIG. 15A, the resist film 21 patterned into a predetermined shape is formed on the oxide semiconductor film 12 formed on the supporting base 11. Subsequently, as illustrated in FIG. 15B, irradiation with the hydrogen-containing gas G3 is performed. This causes the hydrogen-containing gas G3 to enter into the oxide semiconductor film 12 exposed from the opening 21H formed in the resist film 21, thereby forming the reduction layer 12M. Next, as illustrated in FIG. 15C, the reduction layer 12M is sputtered by irradiation with the oxygen-containing gas G4. Thus, the reduction layer 12M is etched to form the opening 12H in the oxide semiconductor film 12. In addition, oxygen is supplied into the reduction layer 12M simultaneously with this sputtering to recover the composition of the reduction layer 12M to substantially the same composition as the composition of the inner portion of the oxide semiconductor film 12. Furthermore, the region (the grain boundary layer) 12G is formed the by entry of oxygen plasma. The region (the grain boundary layer) 12G has a composition not different from the composition of the inner portion of the oxide semiconductor film 12 and has a higher grain boundary density than the inner portion of the oxide semiconductor film 12.

It is to be noted that the grain boundary layer 12G is formed on a side surface of a pattern formed by etching and a bottom surface of an opening formed by etching in a case where etching is stopped in progress.

It is to be noted that in the fourth to sixth embodiments described above, a film to be etched is the oxide semiconductor film; however, the etching method according to the present disclosure is applicable to a metal oxide film. Examples of metal oxides include magnetite ($Fe_3O_4$), alumina ($Al_2O_3$), titania ($TiO_2$), zirconia ($ZrO_2$), tantalum pentoxide ($Ta_2O_5$), hafnia ($Hf_2O_3$), and magnesium oxide (MgO). Using the etching method according to the present disclosure for processing of the metal oxide film makes it possible to control a processed film thickness of the metal oxide film and microfabricate the metal oxide film.

7. Application Examples

The oxide semiconductor film 12 processed with use of the etching method described in the first embodiment (or any of the second to sixth embodiments) described above is applicable to electronic devices described below, for example.

Application Example 1

FIG. 16 illustrates an overall configuration of an imaging apparatus (an imaging element 1) that uses the oxide semiconductor film 12 processed with use of the etching method described in the first embodiment (or any of the second to sixth embodiments) described above. The imaging element 1 is a CMOS image sensor, and includes a pixel section 1a as an imaging region on a semiconductor substrate 30 and includes, in a peripheral region of the pixel section 1a, a peripheral circuit unit 130 that includes, for example, a row scanner 131, a horizontal selector 133, a column scanner 134, and a system controller 132. The etching methods of the oxide semiconductor film according to the first embodiment and the like described above are preferably used for processing of a pair or electrodes (a lower electrode 41 and an upper electrode 45) and an electric charge accumulation layer 43 included in an organic photoelectric converter 40, for example (both refer to FIG. 17). The imaging element 1 is described below.

The pixel section 1a includes a plurality of unit pixels P (each corresponding to a photoelectric conversion element 10) two-dimensionally arranged in rows and columns, for example. The unit pixels P are wired with pixel drive lines Lread (specifically, row selection lines and reset control lines) for respective pixel rows and vertical signal lines Lsig for respective pixel columns. The pixel drive lines Lread transmit drive signals for signal reading from the pixels. The pixel drive lines each have one end coupled to a corresponding one of output terminals, corresponding to the respective rows, of the row scanner 131.

The row scanner 131 includes a shift register, an address decoder, and the like, and serves as a pixel driver, for example, that drives the respective unit pixels P in the pixel section 1a on a row-by-row basis. A signal outputted from each of the unit pixels P of a pixel row selectively scanned by the row scanner 131 is supplied to the horizontal selector 133 through each of the vertical signal lines Lsig. The horizontal selector 133 includes an amplifier, a horizontal selection switch, and the like provided for each of the vertical signal lines Lsig.

The column scanner 134 includes a shift register, an address decoder, and the like, and drives respective horizontal selection switches of the horizontal selector 133 in sequence while scanning the horizontal selection switches. Such selective scanning by the column scanner 134 causes the signals of the respective pixels transmitted through the respective vertical signal lines Lsig to be outputted in sequence to a horizontal signal line 135 and thereafter transmitted to outside of the semiconductor substrate 30 through the horizontal signal line 135.

Circuit components including the row scanner 131, the horizontal selector 133, the column scanner 134, and the horizontal signal line 135 may be formed directly on the semiconductor substrate 30 or disposed in an external control IC. Alternatively, these circuit components may be formed on any other substrate coupled by a cable and the like.

The system controller 132 receives a clock given from outside of the semiconductor substrate 30 or data etc. on instructions of operation modes, and also outputs data such as internal information of the imaging element 1. The system controller 132 further includes a timing generator that generates various timing signals, and performs drive control of the peripheral circuits such as the row scanner 131, the horizontal selector 133, and the column scanner 134, on the basis of the various timing signals generated by the timing generator.

FIG. 17 schematically illustrates an example of a cross-sectional configuration of the photoelectric conversion element 10 used as one pixel (unit pixel P) in the imaging element 1. The photoelectric conversion element 10 is of a so-called longitudinal spectral type in which, for example, one organic photoelectric converter 40 and two inorganic photoelectric converters 32B and 32R are stacked in a longitudinal direction. The organic photoelectric converter 40 is provided on a first surface (back surface) 30S1 side of the semiconductor substrate 30. The inorganic photoelectric converters 32B and 32R are formed to be embedded in the semiconductor substrate 30, and are stacked in a thickness direction of the semiconductor substrate 30. The organic photoelectric converter 40 includes a photoelectric conversion layer 44 formed with use of an organic material between the lower electrode 41 and the upper electrode 45 that are opposed to each other. The photoelectric conversion layer 44 includes a p-type semiconductor and an n-type semiconductor, and has a bulk heterojunction structure in a layer. The bulk heterojunction structure is a p/n junction surface formed through mixture of the p-type semiconductor and the n-type semiconductor.

In this photoelectric conversion element 10, the organic photoelectric converter 40 includes, for each pixel, the lower electrode 41 that includes a plurality of electrodes (a readout electrode 41A and an accumulation electrode 41B), and includes an insulating layer 42 and an electric charge accumulation layer 43 in order between the lower electrode 41 and the photoelectric conversion layer 44. The insulating layer 42 is provided with an opening 42H above the readout electrode 41A, and the readout electrode 41A is electrically coupled to the electric charge accumulation layer 43 through the opening 42H.

The organic photoelectric converter 40 and the inorganic photoelectric converters 32B and 32R selectively detect light in mutually different wavelength ranges to perform photoelectric conversion. For example, the organic photoelectric converter 40 acquires a green (G) color signal. The inorganic photoelectric converters 32B and 32R respectively acquire a blue (B) color signal and a red (R) color signal by a difference in absorption coefficient. This allows the photoelectric conversion element 10 to acquire a plurality of color signals in one pixel without using a color filter.

For example, floating diffusions (floating diffusion layers) FD1, FD2, and FD3, a transfer transistor Tr2 (a longitudinal type) transistor, and a transfer transistor Tr3, an amplifier transistor (modulator) AMP, a reset transistor RST, a select transistor SEL, and a multilayer wiring layer 50 are provided on a second surface (a front surface) 30S2 of the semiconductor substrate 30. The multilayer wiring layer 50 has a configuration in which wiring layers 51, 52, and 53 are stacked in an insulation layer 54.

It is to be noted that in the drawings, the first surface 30S1 side of the semiconductor substrate 30 is represented as a light entering side S1 and a second surface 30S2 side is represented as a wiring layer side S2.

The organic photoelectric converter 40 has a configuration in which, for example, the lower electrode 41, the electric charge accumulation layer 43, the photoelectric conversion layer 44, and the upper electrode 45 are stacked in this order from the first surface 30S1 side of the semiconductor substrate 30. Moreover, an insulation layer 42 is provided between the lower electrode 41 and the electric charge accumulation layer 43. Of the lower electrode 41, the readout electrode 41A is electrically coupled to the photoelectric conversion layer 44 through the opening 42H provided in the insulating layer 42. For example, a fixed electric charge 33, a dielectric layer 34, and an interlayer insulating layer 37 are provided between the first surface 30S1 of the semiconductor substrate 30 and the lower electrode 41. A protective layer 46 is provided on the upper electrode 45. For example, a light-shielding film 47 is provided above the readout electrode 41A in the protective layer 46. Optical members such as a planarization layer (not illustrated) and an on-chip lens 48 are disposed above the protective layer 46.

A through electrode 36 is provided between the first surface 30S1 and the second surface 30S2 of the semiconductor substrate 30. The organic photoelectric converter 40 is coupled, through the through electrode 36, to a gate Gamp of the amplifier transistor AMP and one source-drain region 36B of the reset transistor RST (a reset transistor Tr1rst) also serving as the floating diffusion FD1. This allows the photoelectric conversion element 10 to well transfer electric charges generated in the organic photoelectric converter 40 on the first surface 30S1 side of the semiconductor substrate 30 to the second surface 30S2 side of the semiconductor substrate 30 through the through electrode 36, thereby improving characteristics.

The imaging element 1 described above is applicable to various kinds of electronic apparatuses. Examples of the electronic apparatuses include an imaging apparatus such as a digital still camera and a digital video camera, a mobile phone having an imaging function, and other apparatuses having imaging functions.

FIG. 18 is a block diagram illustrating a configuration example of an imaging apparatus (an imaging apparatus 201) as an electronic apparatus to which the present technology is applied.

The imaging apparatus 201 illustrated in FIG. 18 includes an optical system 202, a shutter apparatus 203, a solid-state imaging element 204, a control circuit 20, a signal processing circuit 206, a monitor 207, and a memory 208, and is able to capture a still image or a moving image.

The optical system 202 includes one or a plurality of lenses, and guides light (incident light) from a subject to the solid-state imaging element 204 and forms an image on a light reception surface of the solid-state imaging element 204.

The shutter apparatus 203 is disposed between the optical system 202 and the solid-state imaging element 204, and controls a period in which the solid-state imaging element 204 is irradiated with the light and a period in which the light is blocked.

The solid-state imaging element 204 includes a package that includes the imaging element 1 described above. The solid-state imaging element 204 accumulates signal electric charges for a fixed period in accordance with light of which an image is formed on the light reception surface through the optical system 202 and the shutter apparatus 203. The signal electric charges accumulated in the solid-state imaging element 204 are transferred in accordance with a drive signal (a timing signal) supplied from the control circuit 205.

The control circuit 205 outputs a drive signal for controlling a transfer operation of the solid-state imaging element 204 and a shutter operation of the shutter apparatus 203 to drive the solid-state imaging element 204 and the shutter apparatus 203.

The signal processing circuit 206 performs various types of signal processing on signal electric charges outputted from the solid-state imaging element 204. An image (image data) captured by performing signal processing by the signal processing circuit 206 is supplied to and displayed on the monitor 207, or is supplied to and stored (recorded) in the memory 208.

Application Example 2

FIG. 19 illustrates a schematic configuration of a reflective display apparatus 2. The reflective display apparatus 2 is an electrophoretic display that generates contrast with use of an electrophoretic phenomenon, and an electrophoretic element (an electrophoretic element 80) is used for a display layer provided between a drive substrate 60 and a counter substrate 70. The etching method of the oxide semiconductor film according to the first embodiment or the like described above is suitably used for processing of a counter electrode 72 included in the counter substrate 70. It is to be noted that FIG. 19 schematically illustrates a configuration of the reflective display apparatus 2, and is different from actual dimensions and shapes.

The reflective display apparatus 2 includes the drive substrate 60 and the counter substrate 70 that are opposed to each other with the electrophoretic element 80 interposed therebetween, and has a display surface on the counter substrate 70 side. The "having the display surface on the counter substrate 70 side" means that an image is displayed toward the counter substrate 70 side (a user is allowed to see the image from the counter substrate 70 side).

The drive substrate 60 includes, for example, a thin film transistor (TFT) 62, a protective layer 63, a planarization insulating layer 64, and a pixel electrode 65 that are formed in this order on one surface of a supporting base 61. The TFT 62 and the pixel electrode 65 are dividedly arranged and dividedly formed in a matrix or in a segment in accordance with a pixel pattern or the like, for example.

The counter substrate 70 includes, for example, a supporting base 71 and the counter electrode 72, and the counter electrode 72 is provided on a surface opposed to the drive substrate 60 of the supporting base 71. The counter electrode 72 may be arranged in a matrix or a segment, as with the pixel electrode 65.

The electrophoretic element 80 includes electrophoretic particles 82 and a porous layer 83 in an insulating liquid 81, as illustrated in FIG. 19. The electrophoretic particles 82 are dispersed in the insulating liquid 81, and the porous layer 83 includes, for example, a fibrous structure and non-electrophoretic particles, and has a plurality of fine holes 833. A partition wall 85 is provided between the drive substrate 60 and the counter substrate 70. The partition wall 85 holds a space between the drive substrate 60 and the counter substrate 70, for example, and partitions the space between the drive substrate 60 and the counter substrate 70 for each pixel, for example.

It is to be noted that the configuration of the reflective display apparatus 2 illustrated in FIG. 19 is one example, and may be modified in a variety of ways. For example, an optical member such as a wavelength conversion layer may be provided on the display surface side of the counter substrate 70. The wavelength conversion layer converts a wavelength of an invisible region into a wavelength of a visible region.

It is to be noted that the imaging element 1 illustrated in FIG. 16 as the application example 1 described above is applicable to the following products.

Application Example 3

<Example of Practical Application to Endoscopic Surgery System>

The technology (present technology) according to the present disclosure is applicable to various products. For example, the technology according to the present disclosure may be applied to an endoscopic surgery system.

FIG. 20 is a view depicting an example of a schematic configuration of an endoscopic surgery system to which the technology according to an embodiment of the present disclosure (present technology) can be applied.

In FIG. 20, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as, a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

FIG. 21 is a block diagram depicting an example of a functional configuration of the camera head 11102 and the CCU 11201 depicted in FIG. 20.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

One example of the endoscopic surgery system to which the technology according to the present disclosure may be applied has been described above. The technology according to the present disclosure may be applied to the image pickup unit 11402 among the components described above. Applying the technology according to the present disclosure to the image pickup unit 11402 increases detection accuracy.

It is to be noted that the endoscopic surgery system has been described here as one example, but the technology according to the present disclosure may be additionally applied to, for example, a microscopic surgery system or the like.

Application Example 4

<Example of Practical Application to Mobile Body>

The technology according to the present disclosure is applicable to various products. For example, the technology according to the present disclosure may be achieved as a device mounted on any type of mobile body such as a vehicle, an electric vehicle, a hybrid electric vehicle, a motorcycle, a bicycle, a personal mobility, an airplane, a drone, a vessel, a robot, a construction machine, or an agricultural machine (tractor).

FIG. 22 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 22, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 22, an audio speaker 12061, a display section 12062, and an instrument panel 12063 are illustrated as the output device. The display section 12062 may, for example, include at least one of an on-board display and a head-up display.

FIG. 22 is a diagram depicting an example of the installation position of the imaging section 12031.

In FIG. 22, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 22 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

Description has been given above with reference to the first to sixth embodiments; however, the present disclosure contents are not limited to these embodiments and the like, and may be modified in a variety of ways.

It is to be noted that the etching method of the oxide semiconductor film according to the present disclosure may be configured as below. According to the present technology of the following configuration, for example, the reduction layer having high etching speed is formed in the surface of the oxide semiconductor film with use of the reducing gas, and the reduction layer is sputtered with use of the rare gas, which makes it possible to improve processing speed of the oxide semiconductor film. In addition, the first gas containing hydrogen (H) and the second gas containing oxygen (O) are used, the first gas and the second gas are converted into plasma, and the oxide semiconductor film is sputtered, which makes it possible to suppress change in composition of the oxide semiconductor film before and after etching and to perform etching that causes less deterioration in characteristics. It is to be noted that effects described here are not necessarily limited, and any of effects described in the present disclosure may be included.

(1)

An etching method of an oxide semiconductor film, the etching method including:

forming a reduction layer in an oxide semiconductor film with use of a reducing gas; and sputtering the reduction layer with use of a rare gas.

(2)

The etching method of the oxide semiconductor film according to (1), in which the oxide semiconductor film is irradiated with the reducing gas, and thereafter the oxide semiconductor film is irradiated with the rare gas.

(3)

The etching method of the oxide semiconductor film according to (1) or (2), in which the oxide semiconductor film is irradiated with a mixture of the reducing gas and the rare gas.

(4)

The etching method of the oxide semiconductor film according to (1) or (2), in which the oxide semiconductor film is repeatedly irradiated with the reducing gas and the rare gas in this order.

(5)

The etching method of the oxide semiconductor film according to any one of (1) to (4), in which the reduction layer is formed by desorption of oxygen atoms from the oxide semiconductor film by irradiation with the reducing gas.

(6)

The etching method of the oxide semiconductor film according to any one of (1) to (5), in which at least one kind of hydrogen ($H_2$), ammonia ($NH_3$), hydrogen sulfide ($H_2S$), hydrogen peroxide ($H_2O_2$), ethylene ($C_2H_4$), butane ($C_4H_{10}$), diborane ($B_2H_6$), sulfur dioxide ($SO_2$), nitric oxide (NO), nitrogen dioxide ($NO_2$), carbon monoxide (CO), silicon tetrachloride ($SiCl_4$), or boron trichloride ($BCl_3$) is used as the reducing gas.

(7)

The etching method of the oxide semiconductor film according to any one of (1) to (6), in which plasma density of the reducing gas is $1E+10$ cm$^{-3}$ or less.

(8)

The etching method of the oxide semiconductor film according to any one of (1) to (7), in which at least one kind of helium (He), neon (Ne), argon (Ar), krypton (Kr), or xenon (Xe) is used as the rare gas.

(9)

The etching method of the oxide semiconductor film according to any one of (1) to (8), in which the oxide semiconductor film includes one of indium oxide, indium-tin oxide (ITO), indium-zinc oxide (IZO), indium-gallium oxide (IGO), indium-gallium-zinc oxide (IGZO, In—GaZnO$_4$), indium-tin-zinc oxide (ITZO), IFO (F-doped In$_2$O$_3$), tin oxide (SnO$_2$), ATO (Sb-doped SnO$_2$), FTO (F-doped SnO$_2$), zinc oxide (ZnO), aluminum-zinc oxide (AZO), gallium-zinc oxide (GZO), titanium oxide (TiO$_2$), niobium-titanium oxide (TNO), antimony oxide, a spinel-type oxide, and an oxide having a YbFe$_2$O$_4$ structure, gallium oxide, titanium oxide, niobium oxide, and nickel oxide.

(10)

An etching method of an oxide semiconductor film, the etching method including: using a first gas containing hydrogen (H) and a second gas containing oxygen (O); and converting each of the first gas and the second gas into plasma and sputtering an oxide semiconductor film.

(11)

The etching method of the oxide semiconductor film according to (10), in which the oxide semiconductor film is irradiated with the first gas, and thereafter the oxide semiconductor film is irradiated with the second gas.

(12)

The etching method of the oxide semiconductor film according to (10), in which the oxide semiconductor film is irradiated with a mixture of the first gas and the second gas.

(13)

The etching method of the oxide semiconductor film according to (10) or (11), in which the oxide semiconductor layer is repeatedly irradiated with the first gas and the second gas in this order.

(14)

The etching method of the oxide semiconductor film according to any one of (10) to (13), in which at least one kind of hydrogen (H$_2$), ammonia (NH$_3$), hydrogen sulfide (H$_2$S), hydrogen peroxide (H$_2$O$_2$), diborane (B$_2$H$_6$), or a hydrocarbon gas containing carbon (C) and hydrogen (H) at least in a molecule is used as the first gas.

(15)

The etching method of the oxide semiconductor film according to any one of (10) to (14), in which at least one kind of oxygen (O$_2$), sulfur dioxide (SO$_2$), nitric oxide (NO), nitrogen dioxide (NO$_2$), carbon monoxide (CO), or carbon dioxide (CO$_2$) is used as the second gas.

(16)

An oxide semiconductor workpiece having no change in composition and a different grain boundary density between at least a portion of a surface and its vicinity of an oxide semiconductor film, and an inner portion of the oxide semiconductor film.

(17)

The oxide semiconductor workpiece according to (16), in which a grain boundary layer having a higher grain boundary density than the inner portion is provided in at least the portion of the surface and its vicinity.

(18)

The oxide semiconductor workpiece according to (17), in which the grain boundary layer is formed within a range from the surface of the oxide semiconductor film to 20 nm.

(19)

The oxide semiconductor workpiece according to any one of (16) to (18), in which the oxide semiconductor film includes one of indium oxide, indium-tin oxide (ITO), indium-zinc oxide (IZO), indium-gallium oxide (IGO), indium-gallium-zinc oxide (IGZO, In—GaZnO$_4$), indium-tin-zinc oxide (ITZO), IFO (F-doped In$_2$O$_3$), tin oxide (SnO$_2$), ATO (Sb-doped SnO$_2$), FTO (F-doped SnO$_2$), zinc oxide (ZnO), aluminum-zinc oxide (AZO), gallium-zinc oxide (GZO), titanium oxide (TiO$_2$), niobium-titanium oxide (TNO), antimony oxide, a spinel-type oxide, and an oxide having a YbFe$_2$O$_4$ structure, gallium oxide, titanium oxide, niobium oxide, and nickel oxide.

(20)

An electronic device including:
an oxide semiconductor film,
the oxide semiconductor film having no change in composition and a different grain boundary density between at least a portion of a surface and its vicinity, and an inner portion.

This application claims the benefit of Japanese Priority Patent Application JP2018-089982 filed with Japan Patent Office on May 8, 2018 and Japanese Priority Patent Application JP2019-003233 filed with Japan Patent Office on Jan. 11, 2019, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. An etching method of an oxide semiconductor film, the etching method comprising:
forming a reduction layer in the oxide semiconductor film by irradiating the oxide semiconductor film with a reducing gas; and
sputtering the reduction layer by irradiating the oxide semiconductor film with a rare gas thereafter.

2. The etching method of the oxide semiconductor film according to claim 1, further comprising
irradiating repeatedly the oxide semiconductor film with the reducing gas and the rare gas in this order.

3. The etching method of the oxide semiconductor film according to claim 1, wherein the reduction layer is formed by desorption of oxygen atoms from the oxide semiconductor film by irradiation with the reducing gas.

4. The etching method of the oxide semiconductor film according to claim 1, wherein at least one kind of hydrogen (H$_2$), ammonia (NH$_3$), hydrogen sulfide (H$_2$S), hydrogen peroxide (H$_2$O$_2$), ethylene (C$_2$H$_4$), butane (C$_4$H$_{10}$), diborane (B$_2$H$_6$), sulfur dioxide (SO$_2$), nitric oxide (NO), nitrogen dioxide (NO$_2$), carbon monoxide (CO), silicon tetrachloride (SiCl$_4$), or boron trichloride (BCl$_3$) is used as the reducing gas.

5. The etching method of the oxide semiconductor film according to claim 1, wherein plasma density of the reducing gas is 1E+10 cm$^{-3}$ or less.

6. The etching method of the oxide semiconductor film according to claim 1, wherein at least one kind of helium (He), neon (Ne), argon (Ar), krypton (Kr), or xenon (Xe) is used as the rare gas.

7. The etching method of the oxide semiconductor film according to claim 1, wherein the oxide semiconductor film includes one of indium oxide, indium-tin oxide (ITO), indium-zinc oxide (IZO), indium-gallium oxide (IGO), indium-gallium-zinc oxide (IGZO, In—GaZnO$_4$), indium-tin-zinc oxide (ITZO), IFO (F-doped In$_2$O$_3$), tin oxide (SnO$_2$), ATO (Sb-doped SnO$_2$), FTO (F-doped SnO$_2$), zinc oxide (ZnO), aluminum-zinc oxide (AZO), gallium-zinc oxide (GZO), titanium oxide (TiO$_2$), niobium-titanium oxide (TNO), antimony oxide, a spinel-type oxide, and an oxide having a YbFe$_2$O$_4$ structure, gallium oxide, titanium oxide, niobium oxide, and nickel oxide.

8. An etching method of an oxide semiconductor film, the etching method comprising:
forming a reduction layer in the oxide semiconductor film using a first gas containing hydrogen (H) and a second gas containing oxygen (O);

converting each of the first gas and the second gas into plasma; and sputtering the oxide semiconductor film and forming a region having no change in composition and a different grain boundary density between at least a portion of a surface and its vicinity, and an inner portion.

9. The etching method of the oxide semiconductor film according to claim 8, further comprising:

irradiating the oxide semiconductor film with the first gas; and irradiating the oxide semiconductor film with the second gas thereafter.

10. The etching method of the oxide semiconductor film according to claim 8, further comprising irradiating the oxide semiconductor film with a mixture of the first gas and the second gas.

11. The etching method of the oxide semiconductor film according to claim 8, further comprising irradiating repeatedly the oxide semiconductor film with the first gas and the second gas in this order.

12. The etching method of the oxide semiconductor film according to claim 8, wherein at least one kind of hydrogen ($H_2$), ammonia ($NH_3$), hydrogen sulfide ($H_2S$), hydrogen peroxide ($H_2O_2$), diborane ($B_2H_6$), or a hydrocarbon gas containing carbon (C) and hydrogen (H) at least in a molecule is used as the first gas.

13. The etching method of the oxide semiconductor film according to claim 8, wherein at least one kind of oxygen ($O_2$), sulfur dioxide ($SO_2$), nitric oxide (NO), nitrogen dioxide ($NO_2$), carbon monoxide (CO), or carbon dioxide ($CO_2$) is used as the second gas.

14. An oxide semiconductor workpiece having no change in composition and a different grain boundary density between at least a portion of a surface and its vicinity of an oxide semiconductor film, and an inner portion of the oxide semiconductor film.

15. The oxide semiconductor workpiece according to claim 14, wherein a grain boundary layer having a higher grain boundary density than the inner portion is provided in at least the portion of the surface and its vicinity.

16. The oxide semiconductor workpiece according to claim 15, wherein the grain boundary layer is formed within a range from the surface of the oxide semiconductor film to 20 nm.

17. The oxide semiconductor workpiece according to claim 14, wherein the oxide semiconductor film includes one of indium oxide, indium-tin oxide (ITO), indium-zinc oxide (IZO), indium-gallium oxide (IGO), indium-gallium-zinc oxide (IGZO, In—$GaZnO_4$), indium-tin-zinc oxide (ITZO), IFO (F-doped $In_2O_3$), tin oxide ($SnO_2$), ATO (Sb-doped $SnO_2$), FTO (F-doped $SnO_2$), zinc oxide (ZnO), aluminum-zinc oxide (AZO), gallium-zinc oxide (GZO), titanium oxide ($TiO_2$), niobium-titanium oxide (TNO), antimony oxide, a spinel-type oxide, and an oxide having a $YbFe_2O_4$ structure, gallium oxide, titanium oxide, niobium oxide, and nickel oxide.

18. An electronic device, comprising:

an oxide semiconductor film, the oxide semiconductor film having no change in composition and a different grain boundary density between at least a portion of a surface and its vicinity, and an inner portion.

* * * * *